US012388029B2

(12) United States Patent
Yim et al.

(10) Patent No.: US 12,388,029 B2
(45) Date of Patent: Aug. 12, 2025

(54) SEMICONDUCTOR PACKAGE

(71) Applicant: Samsung Electronics Co., Ltd., Suwon-si (KR)

(72) Inventors: Choongbin Yim, Seoul (KR); Jihwang Kim, Cheonan-si (KR); Jongbo Shim, Asan-si (KR); Jinwoo Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 426 days.

(21) Appl. No.: 17/742,819

(22) Filed: May 12, 2022

(65) Prior Publication Data
US 2023/0042622 A1    Feb. 9, 2023

(30) Foreign Application Priority Data

Aug. 9, 2021    (KR) .......................... 10-2021-0104811

(51) Int. Cl.
*H01L 23/00* (2006.01)
*H01L 21/48* (2006.01)
(Continued)

(52) U.S. Cl.
CPC ........ *H01L 23/562* (2013.01); *H01L 21/4853* (2013.01); *H01L 21/4857* (2013.01); *H01L 21/565* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 25/105* (2013.01); *H01L 2224/214* (2013.01); *H01L 2225/1035* (2013.01); *H01L 2225/1058* (2013.01); *H01L 2924/3511* (2013.01)

(58) Field of Classification Search
CPC ............... H01L 23/562; H01L 23/3128; H01L 23/49816
See application file for complete search history.

(56) References Cited

U.S. PATENT DOCUMENTS 8,035,226 B1    10/2011  Wilcoxen et al.
9,111,821 B2     8/2015  Lin et al.
(Continued)

FOREIGN PATENT DOCUMENTS

KR    10-2021-0073958 A    6/2021

*Primary Examiner* — Syed I Gheyas
(74) *Attorney, Agent, or Firm* — Muir Patent Law, PLLC

(57) ABSTRACT

A semiconductor package includes a first package substrate having a lower surface and an upper surface respectively including a plurality of first lower surface pads and a plurality of first upper surface pads, a second package substrate having a lower surface and an upper surface respectively including a plurality of second lower surface pads and a plurality of second upper surface pads, wherein the plurality of second upper surface pads comprise all of the upper surface pads at the upper surface of the second package substrate, a semiconductor chip provided between the first package substrate and the second package substrate and attached onto the first package substrate, and a plurality of metal core structures connecting some of the plurality of first upper surface pads to some of the plurality of second lower surface pads and not vertically overlapping any of the plurality of second upper surface pads, each metal core structure having a metal core.

18 Claims, 19 Drawing Sheets

(51) Int. Cl.
    *H01L 21/56*     (2006.01)
    *H01L 23/31*     (2006.01)
    *H01L 23/538*     (2006.01)
    *H01L 25/10*     (2006.01)

(56) References Cited

U.S. PATENT DOCUMENTS

| | | |
|---|---|---|
| 9,281,288 B2 | 3/2016 | Lin et al. |
| 9,673,182 B2 | 6/2017 | Huang et al. |
| 9,859,200 B2 | 1/2018 | Park et al. |
| 9,908,203 B2 | 3/2018 | Cheng et al. |
| 10,037,897 B2 | 7/2018 | Kuo et al. |
| 10,867,974 B2 | 12/2020 | Kim |
| 10,879,203 B2 | 12/2020 | Chen et al. |
| 10,950,586 B2 | 3/2021 | Cho |
| 2008/0017968 A1* | 1/2008 | Choi ................. H01L 25/03 257/E23.18 |
| 2012/0193783 A1 | 8/2012 | Hong et al. |
| 2012/0193789 A1* | 8/2012 | Hu ................. H01L 21/56 257/738 |
| 2017/0136582 A1* | 5/2017 | Cheng ............ H01L 23/49894 |
| 2017/0250154 A1 | 8/2017 | Chi et al. |
| 2017/0278830 A1* | 9/2017 | Kim ................. H01L 25/105 |

\* cited by examiner

SEMICONDUCTOR PACKAGE

CROSS-REFERENCE TO RELATED APPLICATION

This application is based on and claims priority under 35 U.S.C. § 119 to Korean Patent Application No. 10-2021-0104811, filed on Aug. 9, 2021, in the Korean Intellectual Property Office, the disclosure of which is incorporated by reference herein in its entirety.

BACKGROUND

Aspects of the inventive concept relate to a semiconductor package, and more particularly, to a fan-out semiconductor package.

According to the rapid development of the electronics industry and the needs of users, electronic devices have been reduced in size, have become more multifunctional, and have been increased in capacity, and accordingly, highly integrated semiconductor chips are required.

In particular, highly integrated semiconductor chips including an increased number of input/output (I/O) terminals have reduced distances between input terminals and output terminals, which may cause interference between the input terminals and the output terminals. Thus, fan-out semiconductor packages are used to increase the distances between the input terminals and the output terminals.

SUMMARY

Aspects of the inventive concept provide a semiconductor package manufactured as a fan-out semiconductor package and having structural reliability and reliability of an electrical connection.

According to an aspect of the inventive concept, a semiconductor package includes a first package substrate having a lower surface and an upper surface respectively including a plurality of first lower surface pads and a plurality of first upper surface pads, a second package substrate having a lower surface and an upper surface respectively including a plurality of second lower surface pads and a plurality of second upper surface pads, wherein the plurality of second upper surface pads comprise all of the upper surface pads at the upper surface of the second package substrate, a semiconductor chip provided between the first package substrate and the second package substrate and attached onto the first package substrate, and a plurality of metal core structures connecting some of the plurality of first upper surface pads to some of the plurality of second lower surface pads and not vertically overlapping any of the plurality of second upper surface pads, each metal core structure having a metal core.

According to another aspect of the inventive concept, a semiconductor package includes a first package substrate having a lower surface and an upper surface respectively including a plurality of first lower surface pads and a plurality of first upper surface pads, a second package substrate having a lower surface and an upper surface respectively including a plurality of second lower surface pads and a plurality of second upper surface pads wherein the plurality of second upper surface pads comprise all of the upper surface pads at the upper surface of the second package substrate, a semiconductor chip provided between the first package substrate and the second package substrate and attached onto the first package substrate, a plurality of metal core structures and a plurality of solder balls, separate from each other, connected between the plurality of first upper surface pads and the plurality of second lower surface pads, and arranged around the semiconductor chip to be isolated from the semiconductor chip in a plan view, and an encapsulant filling a space between the first package substrate and the second package substrate and encapsulating the semiconductor chip, the plurality of metal core structures, and the plurality of solder balls, wherein the plurality of metal core structures do not vertically overlap any of the plurality of second upper surface pads.

According to another aspect of the inventive concept, a semiconductor package includes a first package substrate having a lower surface and an upper surface respectively including a plurality of first lower surface pads and a plurality of first upper surface pads, a second package substrate having a lower surface and an upper surface respectively including a plurality of second lower surface pads and a plurality of second upper surface pads, a semiconductor chip provided between the first package substrate and the second package substrate and attached onto the first package substrate, an encapsulant filling a space between the first package substrate and the second package substrate and surrounding the semiconductor chip, and a plurality of metal core structures and a plurality of solder balls, separate from each other, passing through the encapsulant to connect the plurality of first upper surface pads to the plurality of second lower surface pads, and arranged around the semiconductor chip to be isolated from the semiconductor chip in a plan view, wherein the plurality of metal core structures each include a metal core ball not including solder, wherein the plurality of metal core structures are arranged to have point symmetry with respect to a central portion of the first package substrate in a plan view and do not vertically overlap the plurality of second upper surface pads, and wherein at least some of the plurality of solder balls vertically overlap the plurality of second upper surface pads, and others of the plurality of solder balls do not overlap the plurality of second upper surface pads.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1A:
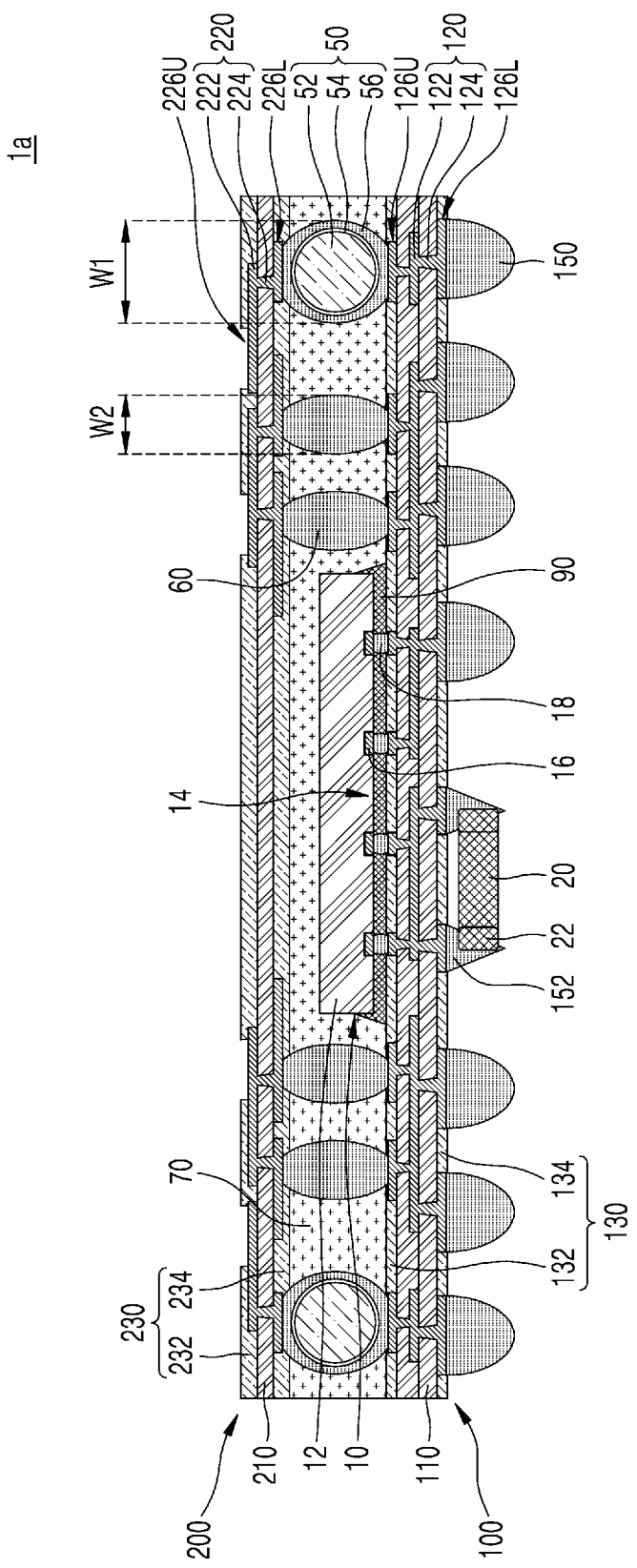
FIGS. 1A and 1B are cross-sectional views illustrating a semiconductor package according to an embodiment.
Figure 1B:
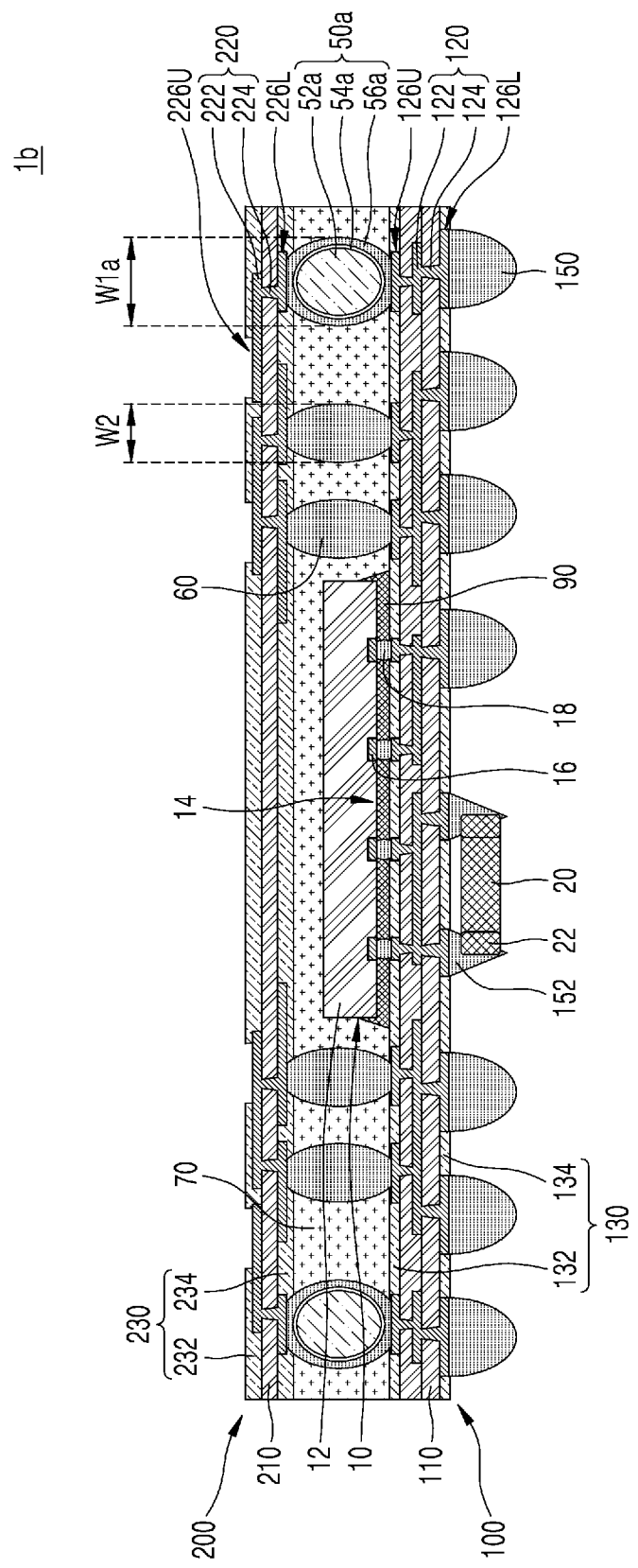

FIGS. 1A and 1B are cross-sectional views illustrating a semiconductor package according to an exemplary embodiment of the inventive concept.

Referring to FIG. 1A, a semiconductor package 1a may include a first package substrate 100, a semiconductor chip 10 attached onto the first package substrate 100, and a second package substrate 200 covering the semiconductor chip 10.

The first package substrate 100 includes a first substrate base 110, and a first wiring structure 120 including a plurality of first wiring patterns 122 on upper and lower surfaces of the first substrate base 110 and a plurality of first substrate vias 124 (also described as through vias) that each pass through at least a part of the first substrate base 110. In some embodiments, the first package substrate 100 may have a stacked structure in which a plurality of first substrate bases 110 are stacked, and the plurality of first wiring patterns 122 may be arranged on upper and lower surfaces of each of the plurality of first substrate bases 110. Some of each of the plurality of first wiring patterns 122 may be a first upper surface pad 126U on an upper surface of the first package substrate 100, and the other part thereof may be a first lower surface pad 126L on a lower surface of the first package substrate 100. The first wiring structure 120 may include a plurality of first upper surface pads 126U and a plurality of first lower surface pads 126L. Among the plurality of first upper surface pads 126U and the plurality of first lower surface pads 126L, the first upper surface pad 126U and the first lower surface pad 126L corresponding to each other may be electrically connected to each other through some of the plurality of first substrate vias 124, or through some of the plurality of first wiring patterns 122 and some of the plurality of first substrate vias 124. Pads, as described herein, are generally formed of a conductive material, are located at a surface of a first component (e.g. substrate, insulating layer, etc.), and have a flat surface facing away from the first component, for connecting to a component or device external to the first component.

In some embodiments, the first package substrate 100 may include or may be a printed circuit board. For example, the first package substrate 100 may include or may be a multi-layer printed circuit board. In some embodiments, the first package substrate 100 may have a redistribution structure including redistribution lines, redistribution vias, and a redistribution insulating layer surrounding the redistribution lines and the redistribution vias.

The first substrate base 110 may be formed of at least one material selected from phenol resin, epoxy resin, and polyimide. The first substrate base 110 may include at least one material selected from among, for example, frame retardant 4 (FR4), tetrafunctional epoxy, polyphenylene ether, epoxy/polyphenylene oxide, bismaleimide triazine (BT), thermount, cyanate ester, polyimide, and liquid crystal polymer.

In some embodiments, the plurality of first wiring patterns 122 and the plurality of first substrate vias 124 may each be formed of a conductive material such as copper. For example, the plurality of first wiring patterns 122 and the plurality of first substrate vias 124 may each be formed of an electrolytically deposited (ED) copper foil, a rolled-annealed (RA) copper foil, an ultra-thin copper foil, sputtered copper, or a copper alloy.

In some embodiments, the first package substrate 100 may further include first solder resist layers 130 covering upper and lower surfaces of the first substrate base 110. The first solder resist layers 130 may include a first upper surface solder resist layer 132 that exposes the plurality of first upper surface pads 126U and covers an upper surface of the first substrate base 110, and a first lower surface solder resist layer 134 that exposes the plurality of first lower surface pads 126L and covers a lower surface of the first substrate base 110.

A plurality of external connection terminals 150 may be attached to at least some of the plurality of first lower surface pads 126L. The plurality of external connection terminals 150 may electrically connect the semiconductor package 1a to the outside of the semiconductor package 1a.

The semiconductor chip 10 may include a semiconductor substrate 12 having an active surface and an inactive surface opposite to each other, a semiconductor device 14 formed on the active surface of the semiconductor substrate 12, and a plurality of chip pads 16 on a first surface of the semiconductor chip 10. In the present specification, the first surface of the semiconductor chip 10 is opposite to a second surface of the semiconductor chip 10, and the second surface of the semiconductor chip 10 indicates the inactive surface of the semiconductor substrate 12. Because the active surface of the semiconductor substrate 12 is very close to the first surface of the semiconductor chip 10, the active surface of the semiconductor substrate 12 and the first surface of the semiconductor chip 10 are not separately illustrated.

In some embodiments, the semiconductor chip 10 may have a face down arrangement in which the first surface faces the first package substrate 100 and may be attached to an upper surface of the first package substrate 100. In this case, the first surface of the semiconductor chip 10 may be referred to as a lower surface of the semiconductor chip 10, and the second surface of the semiconductor chip 10 may be referred to as an upper surface of the semiconductor chip 10. For example, a plurality of chip connection members 18 (also referred to as chip connection terminals) may respectively be between a plurality of chip pads 16 of the semiconductor chip 10 and some of the plurality of first upper surface pads 126U of the first package substrate 100. For example, the plurality of chip connection members 18 may each include a solder ball or a micro bump. The semiconductor chip 10 may be electrically connected to the first package substrate 100 through the plurality of chip connection members 18.

In some embodiments, an underfill layer 90 may be between a lower surface of the semiconductor chip 10 and an upper surface of the first package substrate 100. The underfill layer 90 may surround the plurality of chip connection members 18. The underfill layer 90 may be formed of, for example, a resin material formed by a capillary underfill method.

Unless otherwise specified in the present specification, an upper surface refers to a surface facing upward in the drawing, and a lower surface refers to a surface facing downward in the drawing. Accordingly, spatially relative terms, such as "beneath," "below," "lower," "above," "upper," "top," "bottom," and the like, may be used herein for ease of description to describe positional relationships, such as illustrated in the figures, for example. It will be understood, however, that the spatially relative terms encompass different orientations of the device in addition to the orientation depicted in the figures.

In some embodiments, the semiconductor package 1a may be a lower package of a semiconductor package having a package on package (PoP) structure. In this case, the semiconductor chip 10, the semiconductor substrate 12, the semiconductor device 14, the chip pad 16, and the chip connection member 18, may be respectively referred to as a first semiconductor chip 10, a first semiconductor substrate 12, a first semiconductor device 14, a first chip pad 16, and a first chip connection member 18 or may be respectively referred to as a lower semiconductor chip 10, a lower semiconductor substrate 12, a lower semiconductor device 14, a lower chip pad 16, and a lower chip connection member 18. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The semiconductor substrate 12 may be formed of or may include, for example, a semiconductor material such as silicon (Si) or germanium (Ge. Alternatively, the semiconductor substrate 12 may include a compound semiconductor material such as silicon carbide (SiC), gallium arsenide (GaAs), indium arsenide (InAs), or indium phosphide (InP). The semiconductor substrate 12 may include a conductive region, for example, a well doped with impurities. The semiconductor substrate 12 may have various device isolation structures such as a shallow trench isolation (STI) structure.

A semiconductor device 14 including a plurality of individual devices of various types may be formed on the active surface of the semiconductor substrate 12. The plurality of individual devices may include various microelectronic devices, for example, a metal-oxide-semiconductor field effect transistor (MOSFET) such as a complementary metal-insulator-semiconductor transistor (CMOS), a system large scale integration (LSI), active devices, passive devices, and so on. The plurality of individual devices may be electrically connected to the conductive region of the semiconductor substrate 12. The semiconductor device 14 may further include at least two of the plurality of individual devices, or a conductive wire or a conductive plug electrically connecting the plurality of individual devices to the conductive region of the semiconductor substrate 12. In addition, each of the plurality of individual devices may be electrically isolated from other adjacent individual devices by an insulating layer.

In some embodiments, the semiconductor chip 10 may include a central processing unit (CPU) chip, a graphic processing unit (GPU) chip, or an application processor (AP) chip. In some other embodiments, the semiconductor chip 10 may include, for example, a semiconductor memory chip. The semiconductor memory chip may include a non-volatile semiconductor memory chip such as a flash memory, a phase-change random access memory (PRAM), a magnetoresistive random access memory (MRAM), a ferroelectric random access memory (FeRAM), or a resistive random access memory (RRAM). The flash memory may include, for example, NAND flash memory or V-NAND flash memory. In some embodiments, the semiconductor chip 10 may include a volatile semiconductor memory chip such as dynamic random access memory (DRAM) or static random access memory (SRAM). Though a single chip is shown, the semiconductor chip 10 may be part of a stack of semiconductor chips disposed on an upper surface of the first package substrate 100.

In some embodiments, the semiconductor package 1a may further include an auxiliary chip 20 attached to a lower surface of the first package substrate 100. The auxiliary chip 20 may include a semiconductor chip of a different type from the semiconductor chip 10. In the present specification, the semiconductor chip 10 may be referred to as a main semiconductor chip 10 to distinguish the semiconductor chip 10 from the auxiliary chip 20. The auxiliary chip 20 may have a smaller horizontal width and a smaller horizontal area than the main semiconductor chip 10 and may include a semiconductor chip for assisting an operation of the main semiconductor chip 10. For example, the auxiliary chip 20 may include a silicon capacitor, a controller chip, or a semiconductor memory chip, but is not limited thereto.

In some embodiments, when the main semiconductor chip 10 is a central processing unit chip, a graphic processing unit chip, or an application processor chip, the auxiliary chip 20 may be a silicon capacitor.

In some other embodiments, when the main semiconductor chip 10 is a nonvolatile semiconductor memory chip such as a flash memory, the auxiliary chip 20 may be a controller chip having a controller therein. The controller may control access to data stored in the main semiconductor chip 10. For example, the controller may control a write/read operation of the main semiconductor chip 10, for example, a flash memory or so on, according to a control command from an external host. The controller may perform wear leveling, garbage collection, bad block management, and error correction code (ECC) for the nonvolatile semiconductor memory chip.

In another example embodiment, when the main semiconductor chip 10 is a semiconductor memory chip, the auxiliary chip 20 may be a semiconductor memory chip having a capacity and/or an operation speed different from a capacity and/or an operation speed of the main semiconductor chip 10. For example, the auxiliary chip 20 may include a semiconductor memory chip that performs a buffer function.

The auxiliary chip 20 may include at least two auxiliary chip terminals 22. The auxiliary chip 20 may be electrically connected to some of the plurality of first lower surface pads 126L through a connection solder portion 152 between at least two auxiliary chip terminals 22. A plurality of external connection terminals 150 may be attached to others of the plurality of first lower surface pads 126L.

The second package substrate 200 may cover the semiconductor chip 10 on the first package substrate 100. The second package substrate 200 may be isolated from the semiconductor chip 10 in a vertical direction. In some embodiments, the second package substrate 200 may include a printed circuit board. For example, the second package substrate 200 may include a multi-layer printed circuit board. In some other embodiments, the second package substrate 200 may have a redistribution structure including a redistribution line, a redistribution via, and a redistribution insulating layer surrounding the redistribution line and the redistribution via.

The second package substrate 200 may include a second substrate base 210, and a second wiring structure 220 including a plurality of second wiring patterns 222 arranged on upper and lower surfaces of the second substrate base 210 and a plurality of second substrate vias 224 passing through at least a part of the second substrate base 210. In some embodiments, the second package substrate 200 may include a plurality of second substrate bases 210 which are stacked, and the plurality of second wiring patterns 222 may be respectively arranged on upper surfaces and lower surfaces of the plurality of second substrate bases 210. Some of the plurality of second wiring patterns 222 may be second upper surface pads 226U on an upper surface of the second package substrate 200, and others thereof may be second lower surface pads 226L on a lower surface of the second package substrate 200. Among the plurality of second upper surface pads 226U and the plurality of second lower surface pads 226L, the second surface pads 226U and the second lower surface pads 226L corresponding to each other may be electrically connected to each other through some of the plurality of second substrate vias 224, or through some of the plurality of first wiring patterns 222 and some of the plurality of second substrate vias 224.

In some embodiments, the second package substrate 200 may further include second solder resist layers 230 covering upper and lower surfaces of the second substrate base 210. The second solder resist layers 230 may include a second upper surface solder resist layer 232 that exposes (e.g., does not cover) the plurality of second upper surface pads 226U and covers an upper surface of the second substrate base 210, and a second lower surface solder resist layer 234 that exposes (e.g., does not cover) the plurality of second lower surface pads 226L and covers a lower surface of the second substrate base 210.

In some embodiments, the second package substrate 200, the second substrate base 210, the second wiring structure 220, and the second solder resist layers 230 are respectively and substantially similar to the first package substrate 100, the first substrate base 110, the first wiring structure 120, and the first solder resist layer 130, and thus redundant descriptions thereof are omitted.

In some embodiments, a horizontal width and a horizontal area of the first package substrate 100 may be the same as a horizontal width and a horizontal area of the second package substrate 200.

In some embodiments, the number of wiring layers included in the second package substrate 200 may be less than the number of wiring layers included in the first package substrate 100. In the present specification, the wiring layers indicate places in which circuit wires forming electrical paths on the same plane are arranged. FIG. 1A illustrates that the first package substrate 100 includes three wiring layers and the second package substrate 200 includes two wiring layers, but this is an example and the present specification is not limited thereto.

An encapsulant 70 may fill a space between the first package substrate 100 and the second package substrate 200 and may surround the semiconductor chip 10. The encapsulant 70 may cover an upper surface of the first package substrate 100 and a lower surface of the second package substrate 200. In some embodiments, the encapsulant 70 may fill a space between an upper surface of the semiconductor chip 10 and a lower surface of the second package substrate 200 to isolate the semiconductor chip 10 from the second package substrate 200. The encapsulant 70 may be, for example, a molding member including an epoxy mold compound (EMC).

In some embodiments, edges (e.g., side surfaces) of the first package substrate 100, the second package substrate 200, and the encapsulant 70 may be aligned with each other in a vertical direction (e.g., they may be coplanar).

A plurality of metal core structures 50 and a plurality of solder balls 60 passing through the encapsulant 70 may be between the first package substrate 100 and the second package substrate 200. The plurality of metal core structures 50 and the plurality of solder balls 60 may be isolated from, and therefore may be distanced from, the semiconductor chip 10 in a horizontal direction.

The plurality of metal core structures 50 and the plurality of solder balls 60 may respectively connect the plurality of first upper surface pads 126U to the plurality of second lower surface pads 226L. Upper surfaces of the plurality of metal core structures 50 and the plurality of solder balls 60 may be in contact with the plurality of second lower surface pads 226L, and lower surfaces of the plurality of metal core structures 50 and the plurality of solder balls 60 may be in contact with the plurality of first upper surface pads 126U. It will be understood that when an element is referred to as bei"g "connec"ed" "r "coup"ed" to or "on" another element, it can be directly connected or coupled to or on the other element or intervening elements may be present. In contrast, when an element is referred to as bei"g "directly connec"ed" "r "directly coup"ed" to another element, or as "contacting" or "in contact with" another element, there are no intervening elements present at the point of contact.

Each of the plurality of metal core structures 50 may include a metal core ball 52 and a solder layer 56 surrounding the metal core ball 52. In some embodiments, each of the plurality of metal core structures 50 may further include a barrier layer 54 between the metal core ball 52 and the solder layer 56. The first upper surface pad 126U and the second lower surface pad 226L connected to each of the plurality of metal core structures 50 may be in contact with the solder layer 56. For example, the metal core ball 52 may be formed of a metal such as copper (Cu), aluminum (Al), or tungsten (W), or formed of an alloy of these metals. In some embodiments, the metal core ball 52 may be formed of copper. The metal core ball 52 does not include and is not formed of solder, and thus a metal core structure 50 includes a portion not formed of solder. For example, the barrier layer 54 may be formed of a metal such as nickel (Ni), titanium (Ti), tantalum (Ta), molybdenum (Mo), manganese (Mn), or cobalt (Co), or formed of an alloy of these metals, or formed of conductive nitride of a metal. In some embodiments, the barrier layer 54 may be formed of nickel. For example, the solder layer 56 may be formed of conductive solder. For example, the solder layer 56 may include at least one material selected from Sn, Bi, Ag, and Zn.

The plurality of solder balls 60 may each be formed of conductive solder. For example, the plurality of solder balls 60 may each include at least one material selected from Sn, Bi, Ag, and Zn.

The plurality of metal core structures 50 may each have a first horizontal width W1 (which may be a maximum width of the metal core structure 50), and the plurality of solder balls 60 may each have a second horizontal width W2 (which may be a maximum width of the solder ball 60). The first horizontal width W1 may be greater than the second horizontal width W2, though in some embodiments, the first horizontal width W1 may be substantially the same as the second horizontal width W2. For example, the first horizontal width W1 may be from about 100 μm to about 400 μm, and the second horizontal width W2 in some embodiments may be less than the first horizontal width W1 and may be from about 55 μm to about 220 μm. For example, the second horizontal width W2 may be between about 50% to about 60% of the first horizontal width W1. The plurality of metal core structures 50 may have substantially the same vertical height as the plurality of solder balls 60. Vertical heights of the plurality of metal core structures 50 may be substantially equal to or slightly greater than the first horizontal width W1. In some embodiments, vertical heights of the plurality of solder balls 60 may be substantially equal to or significantly greater than the first horizontal width W1. For example, the vertical heights of the plurality of metal core structures 50 and the plurality of solder balls 60 may be from about 100 μm to about 440 μm. In some embodiments, for each metal core structure 50, its vertical height may be between about 100% and 110% of its horizontal width W1. In some embodiments, for each solder ball 60, its horizontal width W2 may be between about 50% to about 60% of its vertical height. Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In some embodiments, the metal core ball 52 may have a spherical shape having a maximum horizontal width (e.g., a horizontal diameter) and a maximum vertical height (e.g., a vertical diameter) which are substantially equal to each other. For example, a diameter of the metal core ball 52 having a spherical shape may be from about 90 μm to about 360 μm. The barrier layer 54 may conformally cover a surface of the metal core ball 52 with a substantially constant thickness. For example, a thickness of the barrier layer 54 may be from about 0.5 μm to about 5 μm. The solder layer 56 may have a thickness of about 10 μm to about 40 μm and cover the barrier layer 54. A horizontal thickness of the solder layer 56 at a portion where the metal core ball 52 has the greatest horizontal width may be less than a vertical thickness of the solder layer 56 at an upper end and a lower end of the metal core ball 52. For example, the horizontal thickness (in a direction parallel to a surface of the first substrate base 110) of the solder layer 56 at an intermediate portion of the metal core structure 50 in the vertical direction (e.g., a vertical mid-point) may be less than the vertical thickness (in a direction perpendicular to a surface of the first substrate base 110) of the solder layer 56 at the upper end and the lower end of the metal core structure 50.

The plurality of metal core structures 50 may not vertically overlap (e.g., overlap from a top-down view) the plurality of second upper surface pads 226U. For example, in some embodiments, the plurality of second upper surface pads 226U may comprise all of the upper surface pads at the upper surface of the second package substrate, and none of the plurality of metal core structures 50 vertically overlap the plurality of second upper surface pads 226U (e.g., the plurality of metal core structures 50 do not vertically overlap any of the second upper surface pads 226U). The plurality of second upper surface pads 226U may be on the upper surface of the second package substrate 200, at locations which do not vertically overlap any of the plurality of metal core structures 50.

Some of the plurality of solder balls 60 may vertically overlap the plurality of second upper surface pads 226U. Some of the plurality of second upper surface pads 226U may be on the upper surface of the second package substrate 200, at locations which vertically overlap the plurality of solder balls 60. For example, some of the plurality of second upper surface pads 226U may be on the upper surface of the second package substrate 200 at locations which vertically overlap the plurality of solder balls 60, and the others thereof may be on the upper surface of the second package substrate 200 at locations which do not vertically overlap the plurality of solder balls 60. In some embodiments, any one of the plurality of second upper surface pads 226U may be arranged over the upper surface of the second package substrate 200 at a location which vertically partially overlaps one of the plurality of solder balls 60 in the vertical direction and which partially does not overlap any the plurality of solder balls 60 in the vertical direction.

When designing the second package substrate 200, the plurality of second upper surface pads 226U may be arranged at portions that do not vertically overlap the plurality of metal core structures 50a without considering whether or not the plurality of second upper surface pads 226U vertically overlap the plurality of solder balls 60. Accordingly, the plurality of second upper surface pads 226U may not overlap any of the plurality of metal core structures 50 in the vertical direction, and the plurality of second upper surface pads 226U may overlap or may not overlap the plurality of solder balls 60 in the vertical direction (e.g., some second upper surface pads 226U may overlap at least a portion of a respective solder ball 60, while other upper surface pads 226U may not overlap any portion of any solder ball 60 in the vertical direction).

In the semiconductor package 1a according to the inventive concept, the plurality of metal core structures 50 respectively having metal core balls 52 are between the first package substrate 100 and the second package substrate 200, and when the second package substrate 200 is attached onto the first package substrate 100, a distance between the first package substrate 100 and the second package substrate 200 may be maintained by the plurality of metal core structures 50 even when heat is applied thereto or heat and pressure are applied thereto, and thus, structural reliability of the semiconductor package 1a may be increased.

Referring to FIG. 1B, a semiconductor package 1b may include a first package substrate 100, a semiconductor chip 10 attached to the first package substrate 100, and a second package substrate 200 covering the semiconductor chip 10. In some embodiments, the semiconductor package 1b may further include an auxiliary chip 20 attached to a lower surface of the first package substrate 100.

An encapsulant 70 may fill a space between the first package substrate 100 and the second package substrate 200 and may surround the semiconductor chip 10. A plurality of metal core structures 50a and a plurality of solder balls 60 passing through the encapsulant 70 may be between the first package substrate 100 and the second package substrate 200. The plurality of metal core structures 50a and the plurality of solder balls 60 may be horizontally isolated from the semiconductor chip 10.

The plurality of metal core structures 50a and the plurality of solder balls 60 may respectively connect the plurality of first upper surface pads 126U to the plurality of second lower surface pads 226L. Upper surfaces of the plurality of metal core structures 50a and the plurality of solder balls 60 may be in contact with the plurality of second lower surface pads 226L, and lower surfaces of the plurality of metal core structures 50a and the plurality of solder balls 60 may be in contact with the plurality of first upper surface pads 126U.

Each of the plurality of metal core structures 50a may include a metal core ball 52a and a solder layer 56a surrounding the metal core ball 52a. In some embodiments, each of the plurality of metal core structures 50a may further include a barrier layer 54a between the metal core ball 52a and the solder layer 56a. The metal core ball 52a, the barrier layer 54a, and the solder layer 56a are substantially similar to the metal core ball 52, the barrier layer 54, and the solder layer 56 described with reference to FIG. 1A, and thus, redundant descriptions thereof are omitted.

Each of the plurality of metal core structures 50a may have a first horizontal width (e.g., maximum horizontal width) W1a, and each of the plurality of solder balls 60 may have a second horizontal width (e.g., maximum horizontal width) W2. The first horizontal width W1a may be greater than the second horizontal width W2. For example, the first horizontal width W1a may be from about 70 μm to about 360 μm, and the second horizontal width W2 may be less than the first horizontal width W1a and may be from about 55 μm to about 220 μm. For example, the second horizontal width W2 may be between about 60% to about 80% of the first horizontal width W1a. The plurality of metal core structures 50a may have substantially the same vertical heights as the plurality of solder balls 60.

In some embodiments, the metal core ball 52a may have a rugby ball shape, or an oval shape having the greatest vertical height greater than the greatest horizontal width. For example, a diameter of a major axis (e.g., in a vertical direction) of the metal core ball 52a having a rugby ball shape may be from about 90 μm to about 360 μm, and a diameter of a minor axis (e.g., in a horizontal direction) may be from about 60 μm to about 320 μm. The barrier layer 54a may conformally cover a surface of the metal core ball 52a with a substantially constant thickness. For example, a thickness of the barrier layer 54a may be from about 0.5 μm to about 5 μm. The solder layer 56a may have a thickness of about 10 μm to about 40 μm and cover the barrier layer 54a. a horizontal thickness of the solder layer 56a at a portion where the metal core ball 52a has the greatest horizontal width may be less than a vertical thickness of the solder layer 56 at an upper end and a lower end of the metal core ball 52a. That is, a horizontal thickness of the solder layer 56a at an intermediate portion of the metal core structure 50a in the vertical direction (e.g., a vertical midpoint) may be less than the thickness of the solder layer 56a in the vertical direction at the upper end and the lower end of the metal core structure 50a. The solder balls 60 may have more of an American football shape than a rugby ball shape, to have a smaller horizontal width to vertical height ratio than that of the plurality of metal core structures 50a.

The plurality of metal core structures 50a may not vertically overlap the plurality of second upper surface pads 226U. The plurality of second upper surface pads 226U may be on the upper surface of the second package substrate 200 which does not vertically overlap the plurality of metal core structures 50a. Some of the plurality of solder balls 60 may vertically overlap the plurality of second upper surface pads 226U.

When designing the second package substrate 200, the plurality of second upper surface pads 226U may be arranged at portions that do not vertically overlap the plurality of metal core structures 50a without considering whether or not the plurality of second upper surface pads 226U vertically overlap the plurality of solder balls 60. Accordingly, the plurality of second upper surface pads 226U may not overlap any of the plurality of metal core structures 50a in the vertical direction, and the plurality of second upper surface pads 226U may overlap or may not overlap some of the plurality of solder balls 60 in the vertical direction.

In the semiconductor package 1b according to the inventive concept, the plurality of metal core structures 50a respectively having metal core balls 52a are between the first package substrate 100 and the second package substrate 200, and when the second package substrate 200 is attached onto the first package substrate 100, a distance between the first package substrate 100 and the second package substrate 200 may be maintained by the plurality of metal core structures 50a even when pressure is applied thereto, and thus, structural reliability of the semiconductor package 1b may be increased.

Referring to FIGS. 2A to 2D, which show plan layout views illustrating a plan arrangement of major components of a semiconductor package such as depicted for example in FIGS. 1A and 1B, the plurality of metal core structures 50 may be symmetrically arranged in a plan view, and thus, when the second package substrate 200 is attached onto the first package substrate 100, the second package substrate 200 may be prevented from being tilted or warped, in order to increase reliability of an electrical connection between the first package substrate 100 and the second package substrate 200.

In addition, the plurality of second upper surface pads 226U may be arranged in portions that do not overlap the plurality of metal core structures 50 in the vertical direction, and thus, when the second package substrate 200 is attached onto the first package substrate 100, and/or when the encapsulant 70 is formed, the plurality of second upper surface pads 226U may be prevented from wrinkling, bending, or warping even when pressure is applied thereto because the plurality of second upper surface pads 226U are not arranged on the plurality of metal core structures 50 respectively having relatively hard metal core balls 52. Accordingly, reliability of an electrical connection between the plurality of second upper surface pads 226U and an upper package may be increased.

FIGS. 2A to 2D are plan layout views illustrating a plan arrangement of major components of a semiconductor package according to aspects of the inventive concept. Semiconductor packages 2a, 2b, 2c, and 2d illustrated in FIGS. 2A to 2D may each include the features of the semiconductor package 1a illustrated in FIG. 1A or the semiconductor package 1b illustrated in FIG. 1B, and thus, descriptions which are to be made with reference to FIGS. 2A to 2D and overlap the descriptions made with reference to FIGS. 1A and 1B are omitted.

Figure 2A:
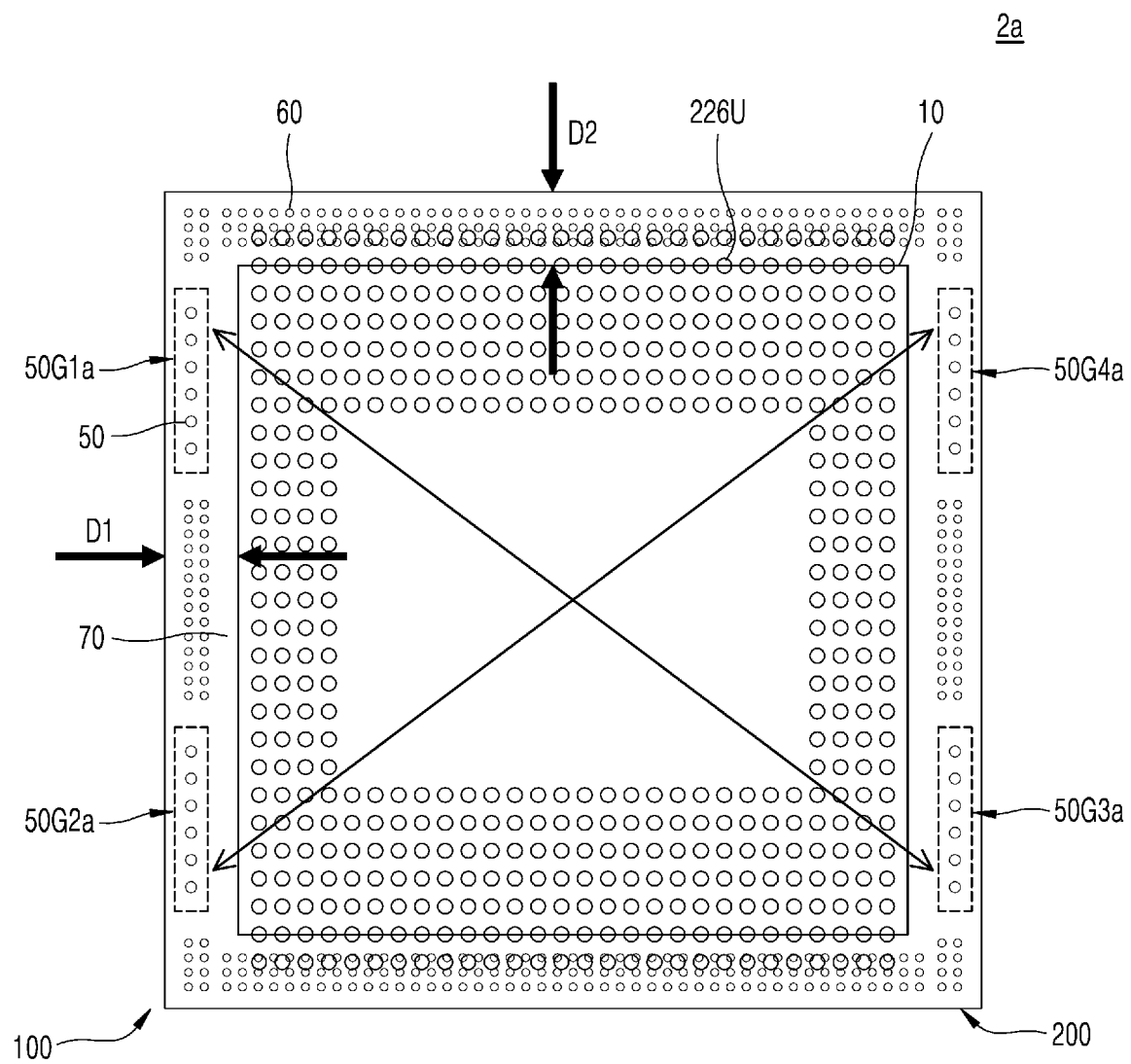
FIGS. 2A to 2D are plan layout views illustrating a plan arrangement of major components of a semiconductor package according to an embodiment.

Referring to FIG. 2A, the semiconductor package 2a includes a first package substrate 100, a second package substrate 200 including a plurality of second upper surface pads 226U, and a semiconductor chip 10, a plurality of metal core structures 50, and a plurality of solder balls 60 between the first package substrate 100 and the second package substrate 200. In FIG. 2A, the only details shown of the first package substrate 100 are at outer regions of the first package substrate 100, adjacent to edges or side surfaces of the first package substrate 100, and the only details shown of the second package substrate 200 are features at outer regions, adjacent to edges or side surfaces of the second package substrate 200, and the plurality of second upper surface pads 226U thereon.

An encapsulant 70 may fill a space between the first package substrate 100 and the second package substrate 200 and may surround the semiconductor chip 10, the plurality of metal core structures 50, and the plurality of solder balls 60.

In a plan view, the semiconductor chip 10 may be in central portions of the first package substrate 100 and the second package substrate 200, and the plurality of metal core structures 50 and the plurality of solder balls 60 may be isolated and horizontally spaced apart from the semiconductor chip 10 and may be arranged adjacent to the edges of the first package substrate 100 and the second package substrate 200 along a periphery of the semiconductor chip 10. The plurality of metal core structures 50 and the plurality of solder balls 60 may be isolated (e.g., physically and electrically separated) from each other, and may be formed in groups that are separated from each other.

In some embodiments, the plurality of metal core structures 50 may be arranged in groups at regions adjacent to two opposite edges among the four edges of each of the first package substrate 100 and the second package substrate 200 and may not be arranged at any regions adjacent to the other two opposite edges thereof.

In a plan view, two opposite edges of the first package substrate 100 may be isolated from two opposite edges of the semiconductor chip 10 corresponding thereto by a first distance D1, and the other two opposite edges of the first package substrate 100 may be isolated from the other two opposite edges of the semiconductor chip 10 corresponding thereto by a second distance D2. In some embodiments, the first distance D1 may be greater than the second distance D2.

In some embodiments, the plurality of metal core structures 50 may be arranged within the first distance D1 between the two opposite edges of the first package substrate 100 and the two opposite edges of the semiconductor chip 10 corresponding thereto, and may not be arranged within the second distance D2 between the other two opposite edges of the first package substrate 100 and the other two opposite edges of the semiconductor chip 10 corresponding thereto. The plurality of solder balls 60 may be between the edges of the first package substrate 100 on which the plurality of metal core structures 50 are not arranged and the edges of the semiconductor chip 10.

The plurality of metal core structures 50 may be arranged to have point symmetry with respect to central portions (e.g., a center point) of the first package substrate 100 and the second package substrate 200 in a plan view, and may also have mirror symmetry with respect to a line extending vertically in the drawing at a mid-point horizontally of the semiconductor package 2a.

The plurality of metal core structures 50 may form a plurality of core structure groups 50G1a, 50G2a, 50G3a, and 50G4a. Each of the plurality of core structure groups 50G1a, 50G2a, 50G3a, and 50G4a may include at least two metal core structures 50. An isolation distance between two adjacent metal core structures 50 included in one of the plurality of core structure groups 50G1a, 50G2a, 50G3a, and 50G4a may be less than an isolation distance between two metal core structures 50 arranged in the other core structure groups among the plurality of core structure groups 50G1a, 50G2a, 50G3a, and 50G4a.

In some embodiments, the plurality of metal core structures 50 may form four core structure groups, namely, a first core structure group 50G1a, a second core structure group 50G2a, a third core structure group 50G3a, and a fourth core structure group 50G4a. The first to fourth core structure groups 50G1a, 50G2a, 50G3a, and 50G4a may be arranged to have point symmetry with respect to central portions of the first package substrate 100 and the second package substrate 200 in a plan view. For example, the first core structure group 50G1a and the third core structure group 50G3a, and the second core structure group 50G2a and the fourth core structure group 50G4a may have point symmetry with respect to the central portions of the first package substrate 100 and the second package substrate 200 in a plan view.

In some embodimentthehe plurality of metal core structures 50 do not overlap the plurality of second upper surface pads 226U in the vertical direction.

Some of the plurality of solder balls 60 may vertically overlap at least one of the plurality of second upper surface pads 226U, and the rest of the plurality of second upper surface pads 226U may not overlap the plurality of solder balls 60 in the vertical direction.

Figure 2B:
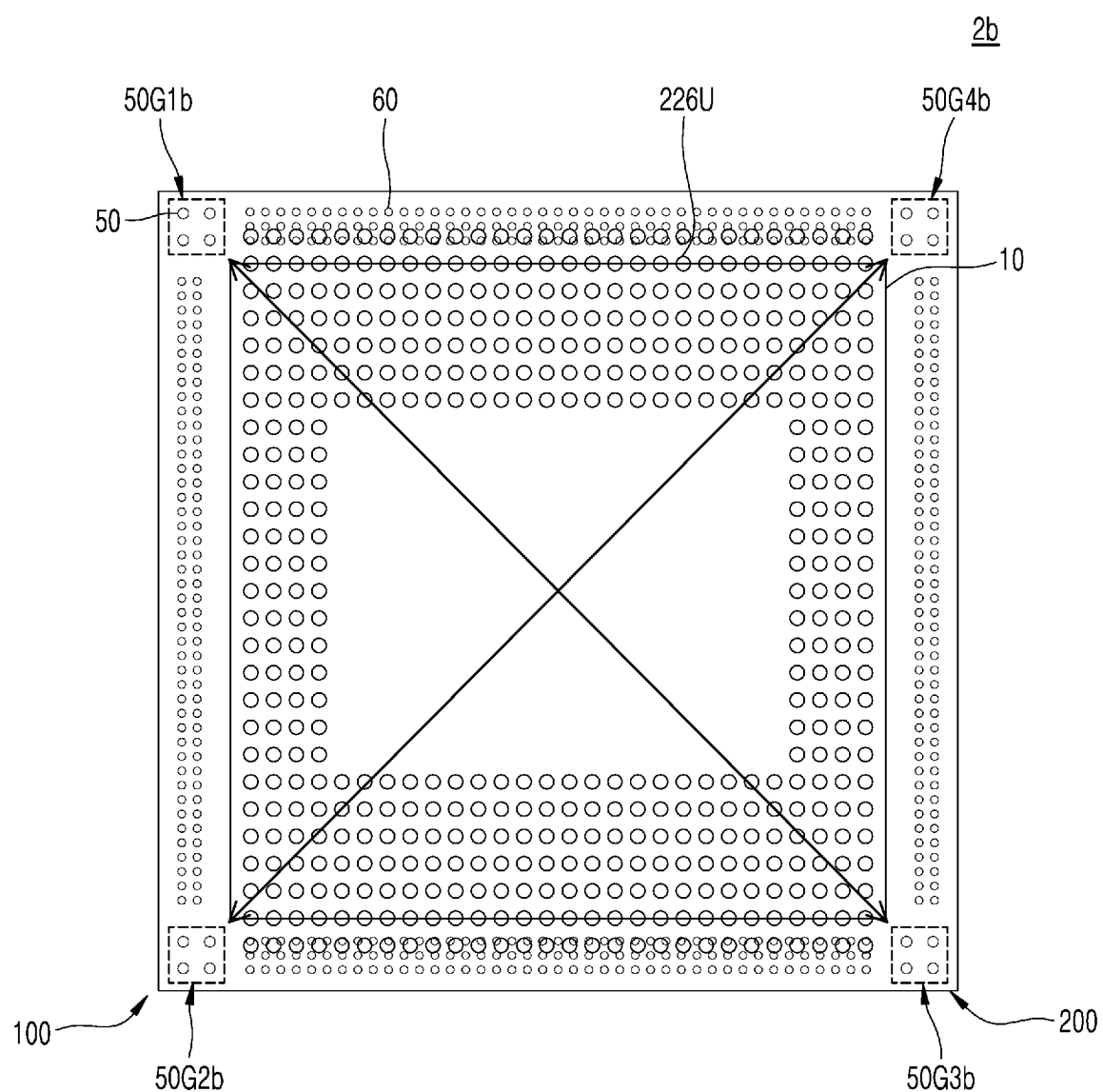

Referring to FIG. 2B, the semiconductor package 2b includes a first package substrate 100, a second package substrate 200 including a plurality of second upper surface pads 226U, and a semiconductor chip 10, a plurality of metal core structures 50, and a plurality of solder balls 60 between the first package substrate 100 and the second package substrate 200.

An encapsulant 70 may fill a space between the first package substrate 100 and the second package substrate 200 and may surround the semiconductor chip 10, the plurality of metal core structures 50, and the plurality of solder balls 60.

In a plan view, the semiconductor chip 10 may be in central portions of the first package substrate 100 and the second package substrate 200, and the plurality of metal core structures 50 and the plurality of solder balls 60 may be isolated from the semiconductor chip 10 and may be arranged adjacent to the edges of the first package substrate 100 and the second package substrate 200 along a periphery of the semiconductor chip 10. The plurality of metal core structures 50 and the plurality of solder balls 60 may be isolated from each other.

In some embodiments, the plurality of metal core structures 50 may be arranged at portions adjacent to four corners of the first package substrate 100 and four corners of the second package substrate 200. The plurality of solder balls 60 may be between the edges of the first package substrate 100 in regions where the plurality of metal core structures 50 are not arranged and the edges of the semiconductor chip 10.

The plurality of metal core structures 50 may be arranged to have point symmetry with respect to central portions (e.g., center points) of the first package substrate 100 and the second package substrate 200 in a plan view.

The plurality of metal core structures 50 may form a plurality of core structure groups 50G1b, 50G2b, 50G3b, and 50G4b. Each of the plurality of core structure groups 50G1b, 50G2b, 50G3b, and 50G4b may include at least two metal core structures 50. An isolation distance between two adjacent metal core structures 50 included in one of the plurality of core structure groups 50G1a, 50G2a, 50G3a, and 50G4a may be less than an isolation distance between two metal core structures 50 arranged in and respectively similarly located in the other core structure groups among the plurality of core structure groups 50G1a, 50G2a, 50G3a, and 50G4a.

In some embodiments, the plurality of metal core structures 50 may form four core structure groups adjacent to the four corners of the first package substrate 100 and the four corners of the second package substrate 200, that is, a first core structure group 50G1b, a second core structure group 50G2b, a third core structure group 50G3b, and a fourth core structure group 50G4b. The first to fourth core structure groups 50G1b, 50G2b, 50G3b, and 50G4b may be arranged to have point symmetry with respect to central portions (e.g., center points) of the first package substrate 100 and the second package substrate 200 in a plan view. For example, the first core structure group 50G1b and the third core structure group 50G3b, and the second core structure group 50G2b and the fourth core structure group 50G4b may have point symmetry with respect to the central portions (e.g., center points) of the first package substrate 100 and the second package substrate 200 in a plan view.

In one embodiment, the plurality of metal core structures 50 do not overlap the plurality of second upper surface pads 226U in the vertical direction.

Some of the plurality of solder balls 60 may vertically overlap at least one of the plurality of second upper surface pads 226U, and the rest of the plurality of second upper surface pads 226U may not overlap the plurality of solder balls 60 in the vertical direction.

Figure 2C:
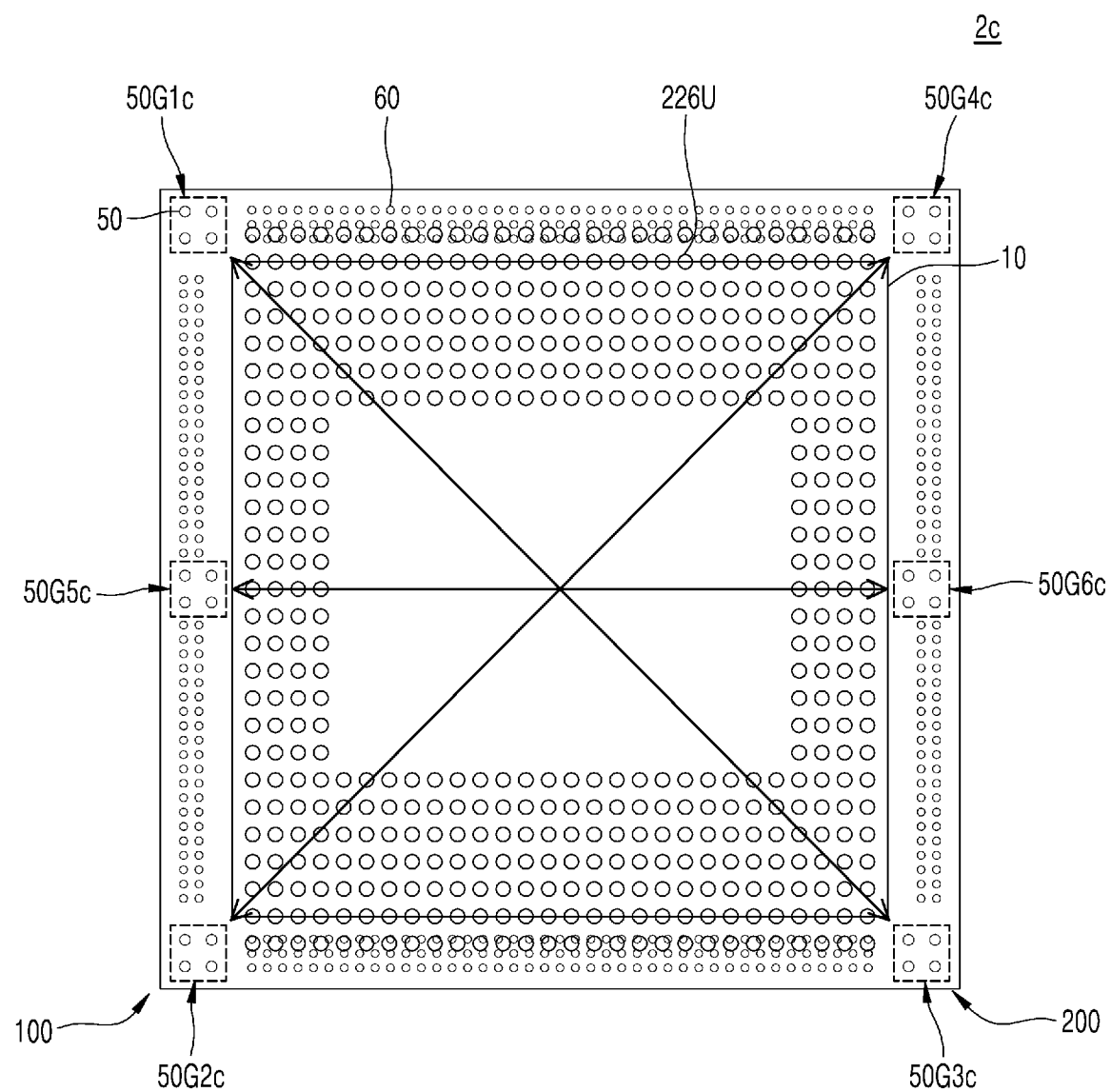

Referring to FIG. 2C, the semiconductor package 2b includes a first package substrate 100, a second package substrate 200 including a plurality of second upper surface pads 226U, and a semiconductor chip 10, a plurality of metal core structures 50, and a plurality of solder balls 60 between the first package substrate 100 and the second package substrate 200.

An encapsulant 70 may fill a space between the first package substrate 100 and the second package substrate 200 and may surround the semiconductor chip 10, the plurality of metal core structures 50, and the plurality of solder balls 60.

In a plan view, the semiconductor chip 10 may be in central portions of the first package substrate 100 and the second package substrate 200, and the plurality of metal core structures 50 and the plurality of solder balls 60 may be isolated from the semiconductor chip 10 and may be arranged adjacent to the edges of the first package substrate 100 and the second package substrate 200 along a periphery of the semiconductor chip 10. The plurality of metal core structures 50 and the plurality of solder balls 60 may be isolated from each other.

In some embodiments, the plurality of metal core structures 50 may be arranged at portions adjacent to four corners of the first package substrate 100 and four corners of the second package substrate 200 and may be arranged at portions adjacent and at a midpoint of to two opposite edges of four edges of each of the first package substrate 100 and the second package substrate 200.

The plurality of metal core structures 50 may be arranged to have point symmetry with respect to central portions (e.g., center points) of the first package substrate 100 and the second package substrate 200 in a plan view.

The plurality of metal core structures 50 may form a plurality of core structure groups 50G1c, 50G2c, 50G3c, 50G4c, 50G5c, and 50G6c. Each of the plurality of core structure groups 50G1c, 50G2c, 50G3c, 50G4c, 50G5c, and 50G6c may include at least two metal core structures 50. An isolation distance between two adjacent metal core structures 50 included in one of the plurality of core structure groups 50G1c, 50G2c, 50G3c, 50G4c, 50G5c, and 50G6c may be less than an isolation distance between two respectively positioned metal core structures 50 arranged in the other core structure groups among the plurality of core structure groups 50G1c, 50G2c, 50G3c, 50G4c, 50G5c, and 50G6c.

In some embodiments, the plurality of metal core structures 50 may form four core structure groups adjacent to the four corners of the first package substrate 100 and the four corners of the second package substrate 200, that is, a first core structure group 50G1b, a second core structure group 50G2b, a third core structure group 50G3b, and a fourth core structure group 50G4b, and may form at least two core structure groups arranged at portions adjacent to and at midpoints of or non-corner portions of two opposite edges of the four edges of each of the first package substrate 100 and the second package substrate 200, that is, a fifth core structure group 50G5c and a sixth core structure group 50G6c. The first to sixth core structure groups 50G1c, 50G2c, 50G3c, 50G4c, 50G5c, and 50G6c may be arranged to have point symmetry with respect to central portions (e.g., center points) of the first package substrate 100 and the second package substrate 200 in a plan view. For example, the first core structure group 50G1c and the third core structure group 50G3c, the second core structure group 50G2c and the fourth core structure group 50G4c, and the fifth core structure group 50G5c and the sixth core structure group 50G6c may have point symmetry with respect to the central portions of the first package substrate 100 and the second package substrate 200 in a plan view.

In one embodiment, the plurality of metal core structures 50 do not overlap the plurality of second upper surface pads 226U in the vertical direction.

Some of the plurality of solder balls 60 may vertically overlap at least one of the plurality of second upper surface pads 226U, and the rest of the plurality of second upper surface pads 226U may not overlap the plurality of solder balls 60 in the vertical direction.

Although the plurality of metal core structures 50 are illustrated as forming six core structure groups 50G1c, 50G2c, 50G3c, 50G4c, 50G5c, and 50G6c in FIG. 2C, the inventive concept is not limited thereto. For example, the plurality of metal core structures 50 may form the four core structure groups 50G1c, 50G2c, 50G3c, and 50G4c arranged at portions adjacent to the four corners of each of the first package substrate 100 and the second package substrate 200 and may form at least one core structure group arranged at non-corner portions adjacent to the four edges of each of the first package substrate 100 and the second package substrate 200. For example, the semiconductor package 2c may include core structure groups of 6, 8, 10, 12, and so on which are a sum of multiples of 2 and 4.

Figure 2D:
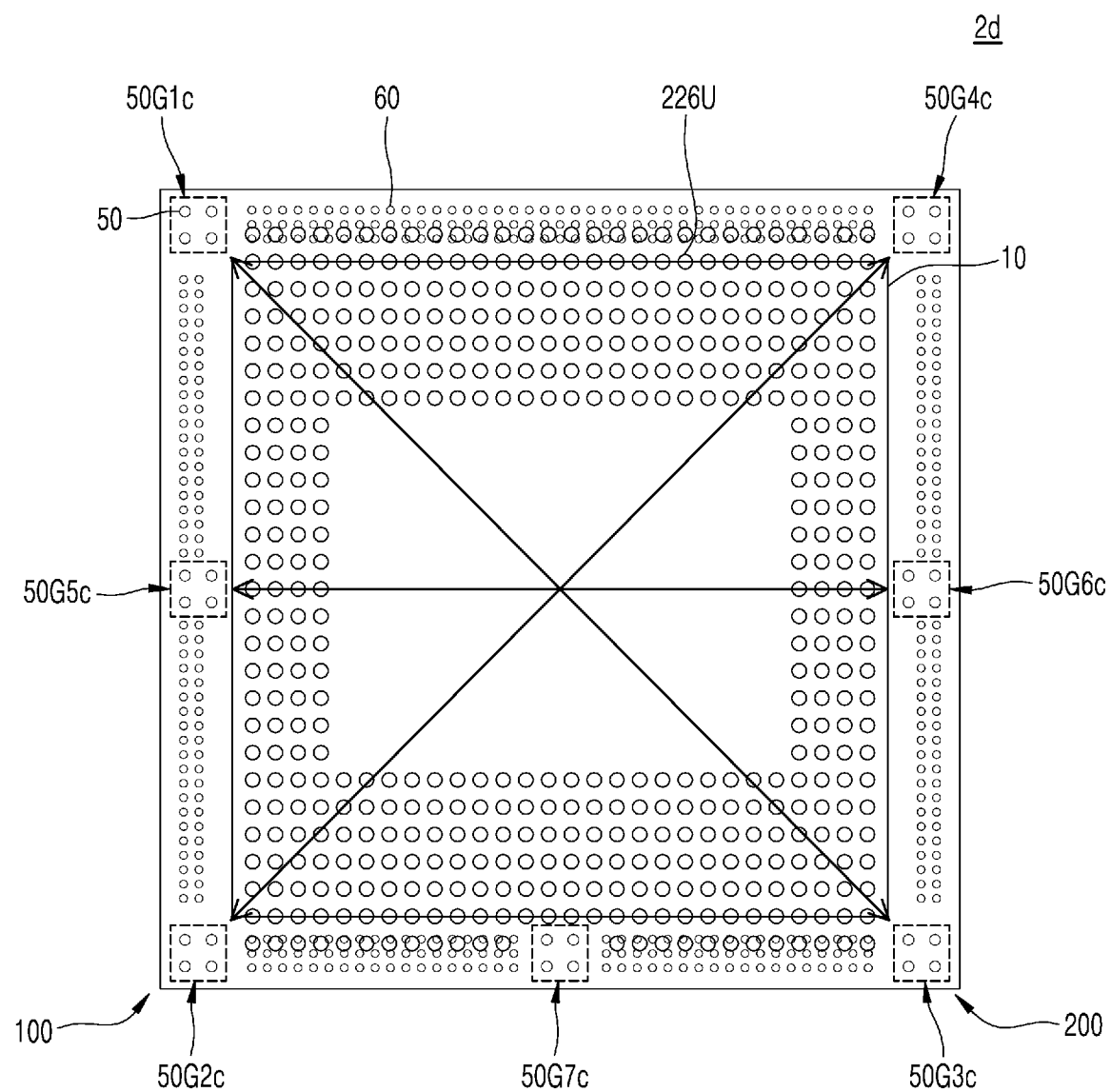

Referring to FIG. 2D, the semiconductor package 2d may further include an auxiliary core structure group 50G7c. Each of at least two metal core structures 50 forming the auxiliary core structure group 50G7c may be referred to as an auxiliary metal core structure. The auxiliary core structure group 50G7c and at least two auxiliary metal core structures 50 forming the auxiliary core structure group 50G7c may not have point symmetry with the core structure groups 50G1c, 50G2c, 50G3c, 50G4c, 50G5c, and 50G6c and the metal core structures 50 forming the core structure groups in a plan view with respect to the central portions of the first package substrate 100 and the second package substrate 200.

The auxiliary core structure group 50G7c and at least two auxiliary metal core structures 50 forming the auxiliary core structure group 50G7c may be arranged at portions in which structural reliability needs to be partially reinforced in the semiconductor package 2d.

Although not illustrated separately, in some embodiments, the semiconductor packages 2a, 2b, and 2c illustrated in FIGS. 2A to 2C further include the auxiliary core structure group 50G7c formed by at least two auxiliary metal core structures 50.

FIGS. 2A to 2D illustrate that the semiconductor packages 2a, 2b, 2c, and 2d include the plurality of metal core structures 50, but the inventive concept is not limited thereto, and the semiconductor packages 2a, 2b, 2c, and 2d may alternatively include the plurality of metal core structures 50a illustrated in FIG.

FIGS. 3A to 3E are cross-sectional views illustrating a method of manufacturing a semiconductor package according to the inventive concept.

Figure 3A:
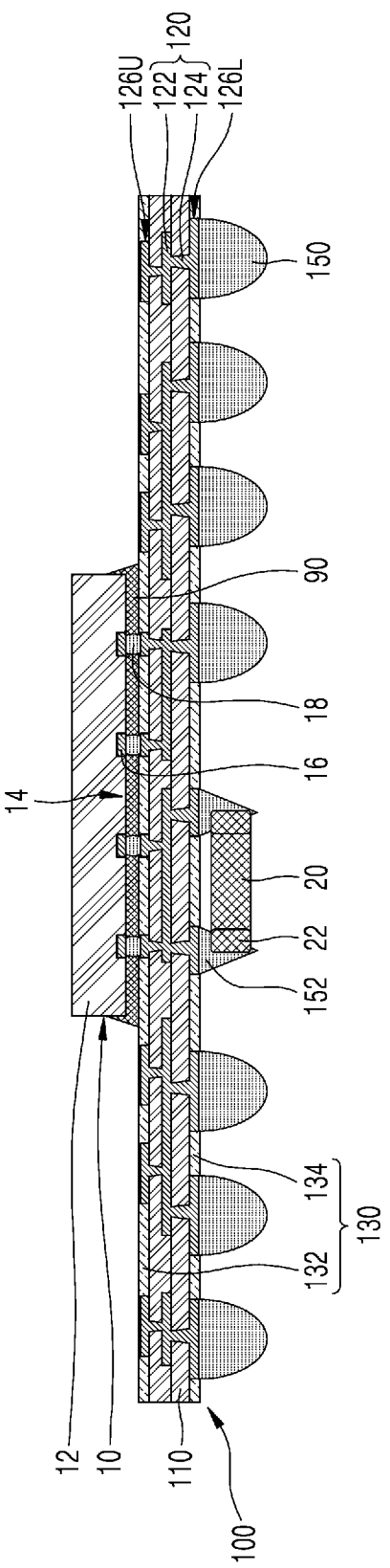
FIGS. 3A to 3E are cross-sectional views illustrating a method of manufacturing a semiconductor package, according to an embodiment.

Referring to FIG. 3A, a first semiconductor chip 10 is attached to an upper surface of the first package substrate 100. For example, after a plurality of chip connection members 18 are attached to a plurality of chip pads 16 of the first semiconductor chip 10, the plurality of chip connection members 18 are attached to some of the plurality of first upper surface pads 126U of the first package substrate 100, and thus, the first semiconductor chip 10 may be attached onto the first package substrate 100. An underfill layer 90 may be formed between the first semiconductor chip 10 and the first package substrate 100. The underfill layer 90 may be formed by inserting a resin material between the first semiconductor chip 10 and the first package substrate 100 by a capillary underfill method. The underfill layer 90 may be formed to fill a space between the first semiconductor chip 10 and the first package substrate 100 and to surround the plurality of chip connection members 18.

A plurality of external connection terminals 150 may be attached to at least some of a plurality of first lower surface pads 126L. In some embodiments, the plurality of external connection terminals 150 may also be attached to a lower surface of the first package substrate 100 after the second package substrate 200 and the encapsulant 70 illustrated in FIG. 1A are formed.

In some embodiments, an auxiliary chip 20 may be attached to the lower surface of the first package substrate 100. The auxiliary chip 20 having at least two auxiliary chip terminals 22 may be attached to the first package substrate 100 by forming a connection solder portion 152 between at least two auxiliary chip terminals 22 and some of the plurality of first lower surface pads 126L.

Figure 3B:
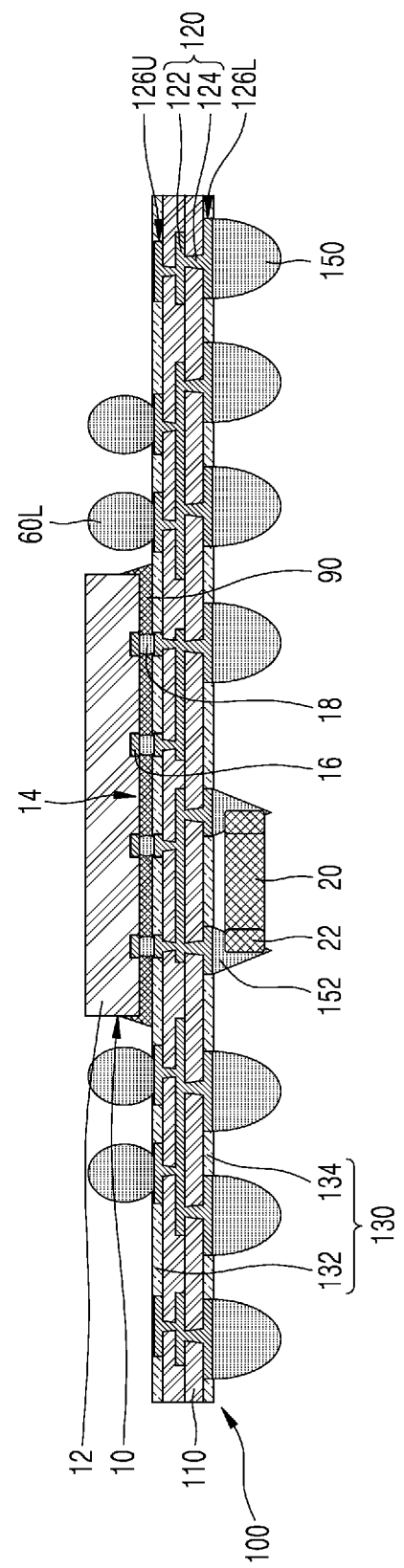

Referring to FIG. 3B, a plurality of lower solder balls 60L are attached to others of the plurality of first upper surface pads 126U. The plurality of lower solder balls 60L may be formed of conductive solder. For example, the plurality of lower solder balls 60L may include at least one material selected from Sn, Bi, Ag, and Zn. Vertical heights of the plurality of lower solder balls 60L may be slightly greater than a half of a vertical height of each of the plurality of solder balls 60 illustrated in FIG. 1A. For example, the vertical heights of the plurality of lower solder balls 60L may be from about 55 µm to about 240 µm. In some embodiments, each lower solder ball 60L may have the same height as other lower solder balls 60L. In some embodiments, some lower solder balls 60L have different heights from each other.

Figure 3C:
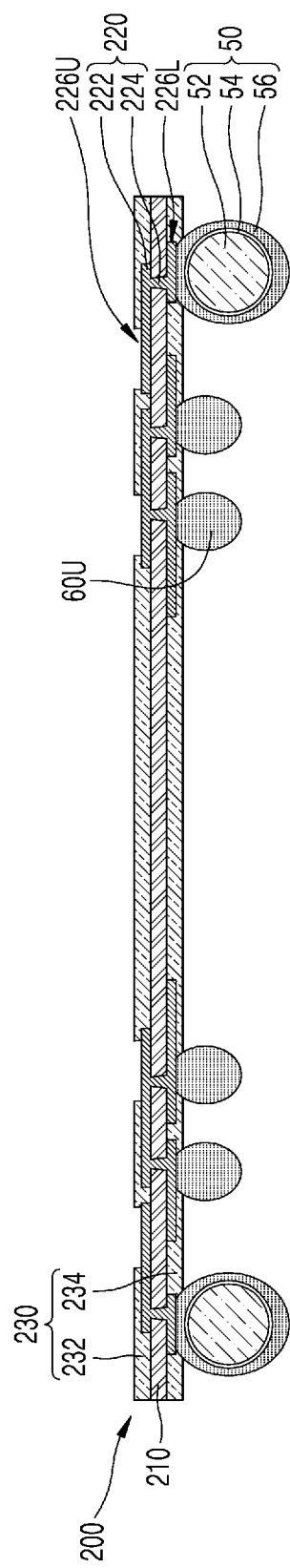

Referring to FIG. 3C, after a second package substrate 200 is prepared, a plurality of metal core structures 50 are attached to some of a plurality of second lower surface pads 226L of the second package substrate 200, and a plurality of upper solder balls 60U are attached to others thereof.

The plurality of metal core structures 50 may be attached to some of the plurality of second lower surface pads 226L that do not vertically overlap the plurality of second upper surface pads 226U. At least some of the others of the plurality of second lower surface pads 226L to which the plurality of upper solder balls 60U are attached may vertically overlap the plurality of second upper surface pads 226U.

The plurality of upper solder balls 60U may be formed of conductive solder. For example, the plurality of upper solder balls 60U may each include at least one material selected from Sn, Bi, Ag, and Zn. Vertical heights of the plurality of upper solder balls 60U may be substantially the same as vertical heights of the plurality of lower solder balls 60L illustrated in FIG. 3B. For example, the vertical heights of the plurality of upper solder balls 60U may be from about 55 µm to about 240 µm. In some embodiments, each upper solder ball 60U may have the same height as other upper solder balls 60U. In some embodiments, some upper solder balls 60U have different heights from each other. In some embodiments, upper solder balls 60U may each have the same height as each of the lower solder balls 60L.

Figure 3D:
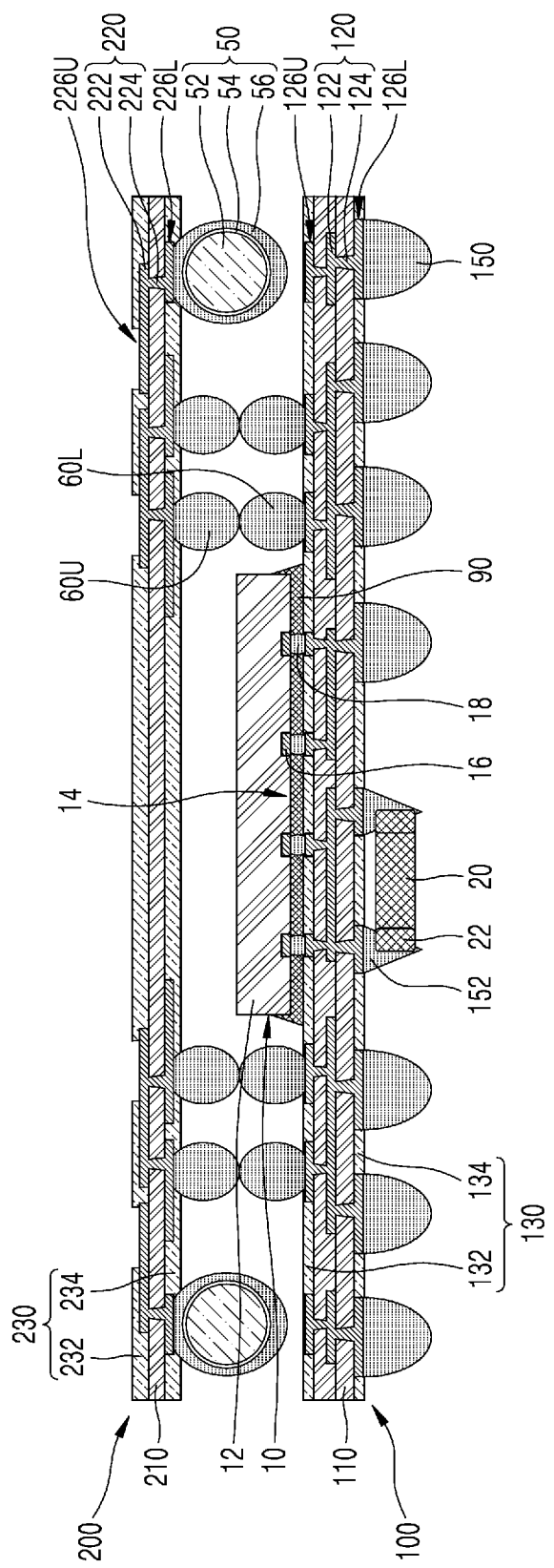

Referring to FIG. 3D, in order for the plurality of upper solder balls 60U to be in contact with the plurality of lower solder balls 60L, the second package substrate 200 to which the plurality of metal core structures 50 and the plurality of upper solder balls 60U are attached, is put on the first package substrate 100 to which the semiconductor chip 10 and the plurality of lower solder balls 60L are attached.

The plurality of metal core structures 50 are symmetrically attached to a lower surface of the second package substrate 200 in a plan view, and thus, when the second package substrate 200 is mounted on the first package substrate 100, the second package substrate 200 is not tilted.

Figure 3E:
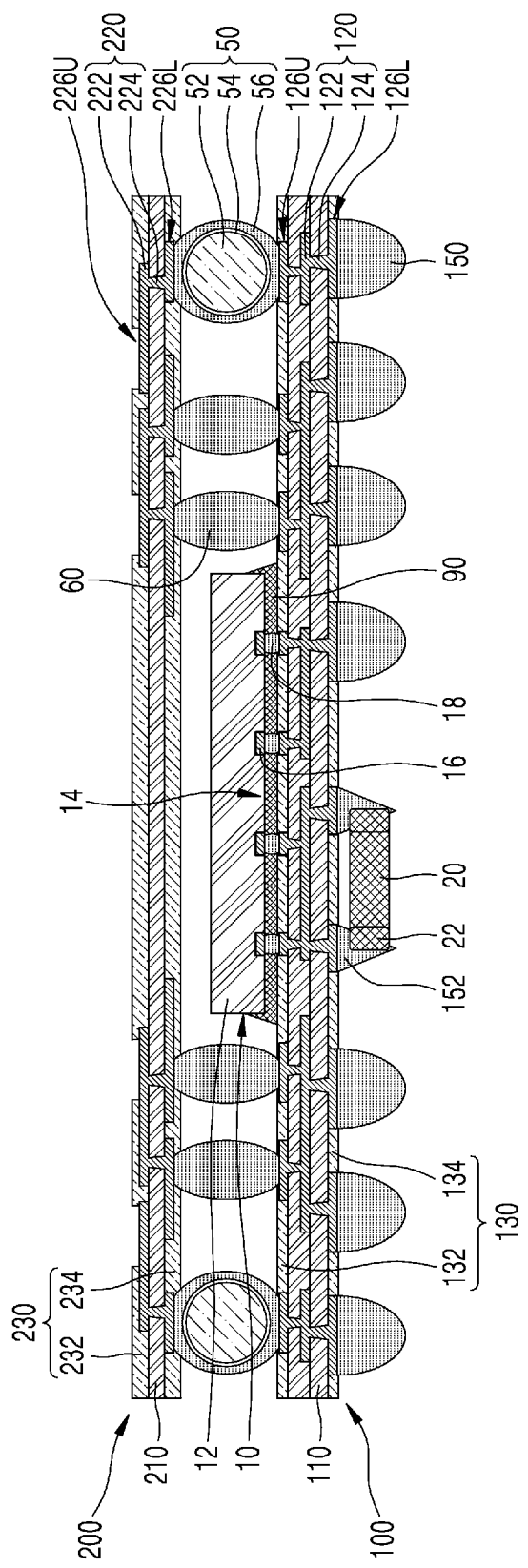

Referring to FIGS. 3D and 3E, solder layers 56 of the plurality of metal core structures 50 are in contact with the plurality of first upper surface pads 126U to be connected thereto, and the plurality of upper solder balls 60U and the plurality of lower solder balls 60L are connected to each other to form a plurality of solder balls 60.

In order to connect the plurality of metal core structures 50 to the first upper surface pad 126 and form the plurality of solder balls 60, heat may be applied to melt the solder layers 56 of the plurality of metal core structures 50, the plurality of upper solder balls 60U, and the plurality of lower solder balls 60L, or pressure may be applied together with heat to the second package substrate 200.

The plurality of metal core structures 50 and the plurality of solder balls 60 may be formed to connect the plurality of first upper surface pads 126U to the plurality of second lower surface pads 226L.

The plurality of metal core structures 50 respectively having metal core balls 52 are between the first package substrate 100 and the second package substrate 200, and thus, when the second package substrate 200 is attached onto the first package substrate 100, a distance between the first package substrate 100 and the second package substrate 200 may be maintained by the plurality of metal core structures 50 even when heat is applied thereto or heat and pressure are applied thereto.

Thereafter, the semiconductor package 1a is manufactured by forming the encapsulant 70 that fills a space between the first package substrate 100 and the second package substrate 200 to surround the semiconductor chip 10, the plurality of metal core structures 50, and the plurality of solder balls 60 as illustrated in FIG. 1A. In some embodiments, pressure may be applied between the first package substrate 100 and the second package substrate 200 during a process of forming the encapsulant 70.

The plurality of metal core structures 50 do not vertically overlap the plurality of second upper surface pads 226U, and thus, even when pressure is applied between the first package substrate 100 and the second package substrate 200, the plurality of second upper surface pads 226U may be prevented from wrinkling because the plurality of second upper surface pads 226U are not located on the plurality of metal core structures 50 respectively having relatively hard metal core balls 52.

FIGS. 4A to 4F are cross-sectional views illustrating semiconductor packages according to the inventive concept. Among the member names and member numbers illustrated in FIGS. 4A to 4F and FIGS. 1A and 1B, the same member names and member numbers may respectively indicate the same member, and in the descriptions made with reference to FIGS. 4A to 4F and FIGS. 1A and 1B, redundant descriptions are omitted.

Figure 4A:
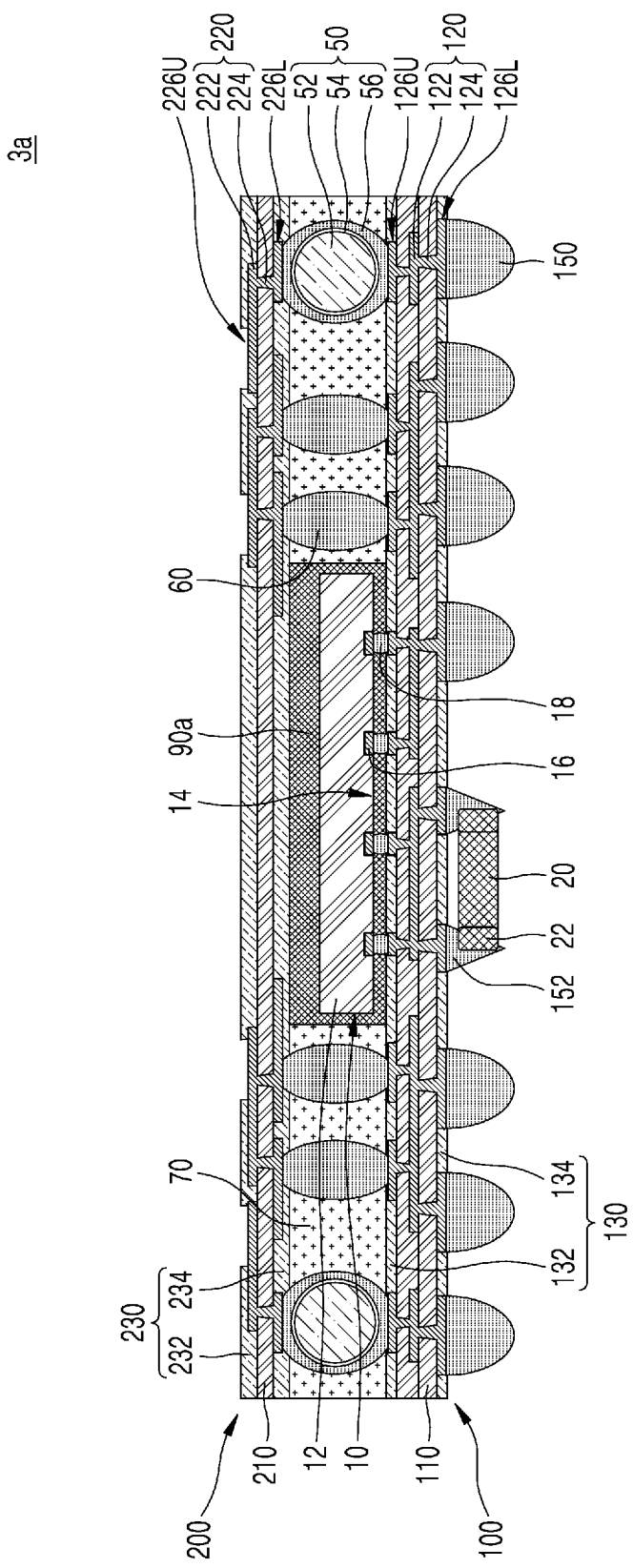
FIGS. 4A to 4F are cross-sectional views illustrating a semiconductor package according to an embodiment.

Referring to FIG. 4A, a semiconductor package 3a includes a first package substrate 100 including a plurality of first upper surface pads 126U and a plurality of first lower surface pads 126L, a second package substrate 200 including a plurality of second upper surface pads 226U and a plurality of second lower surface pads 226L, and a semiconductor chip 10, a plurality of metal core structures 50, and a plurality of solder balls 60 formed in a space between the first package substrate 100 and the second package substrate 200.

The semiconductor package 3a may include an adhesive layer 90a instead of the underfill layer 90 of each of the semiconductor packages 1a and 1b illustrated in FIGS. 1A and 1B. The adhesive layer 90a may be between the first package substrate 100 and the second package substrate 200 to surround the semiconductor chip 10. The adhesive layer 90a may surround a plurality of chip connection members 18, fill a space between an upper surface of the first package substrate 100 and a lower surface of the semiconductor chip 10, surround a side surface of the semiconductor chip 10, and fill a space between an upper surface of the semiconductor chip 10 and the lower surface of the second package substrate 200.

In some embodiments, the adhesive layer 90a may include or be formed of a material that softens when heat is applied thereto and maintains a completely dissolved state or an insoluble state (for example, a b-stage state). In some embodiments, the adhesive layer 90a may include a binder material and a curing material. For example, the binder material included in the adhesive layer 90a may include at least one of an acrylic polymer resin and an epoxy resin. In addition, the curing material included in the adhesive layer 90 may include at least one of an epoxy resin, a phenol-based cured resin, and a phenoxy resin. In addition, the adhesive layer 90a may further include a curing catalyst, an additive such as a silane coupling agent, and a filler such as silica. In some embodiments, the adhesive layer 90a may include a die attach film (DAF) that softens when heat is applied thereto and maintains a completely dissolved state or an insoluble state.

An encapsulant 70 may fill a space between the first package substrate 100 and the second package substrate 200 to surround the semiconductor chip 10, the plurality of metal core structures 50, the plurality of solder balls 60, and the adhesive layer 90a.

Because the semiconductor package 3a includes the adhesive layer 90a including a material that softens when heat is applied thereto and maintains a completely dissolved state or an insoluble state, it is possible to prevent voids from being generated in a space between the first package substrate 100 and the second package substrate 200. Accordingly, structural reliability of the semiconductor package 3a may be increased.

Figure 4B:
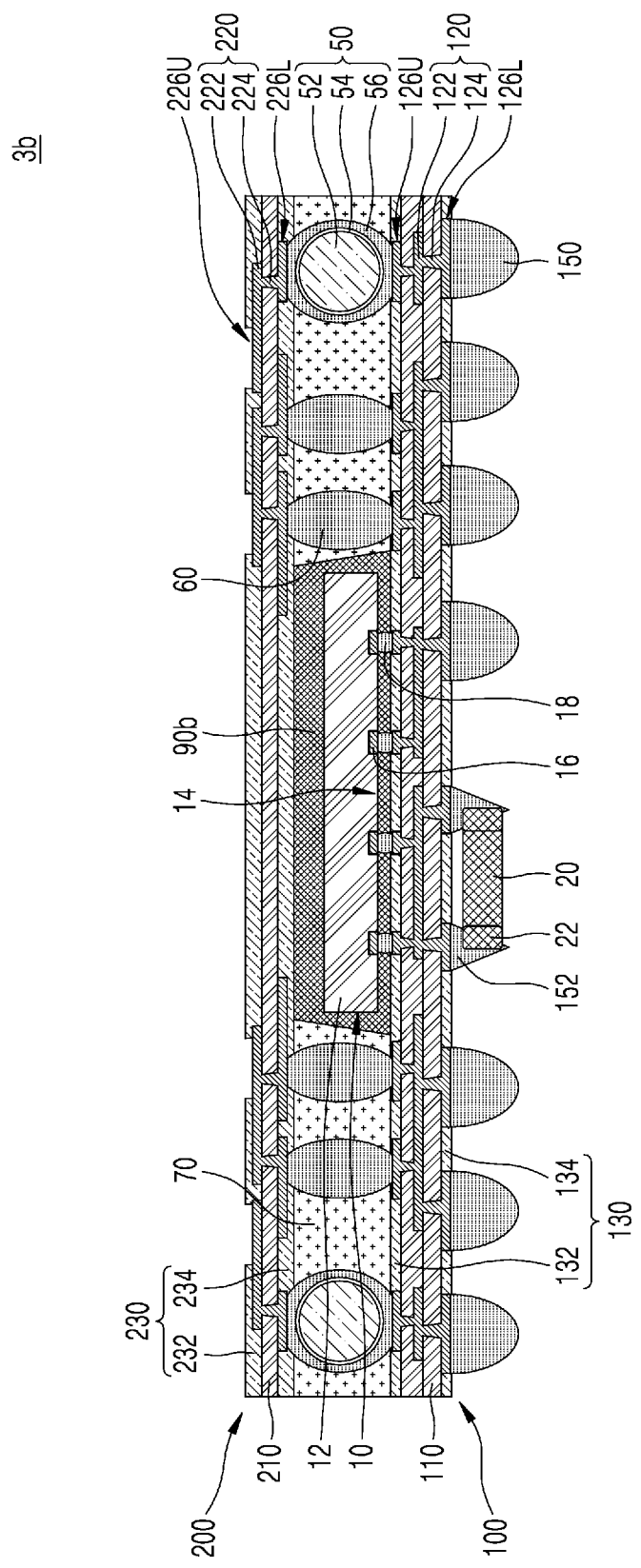

Referring to FIG. 4B, a semiconductor package 3b includes a first package substrate 100 including a plurality of first upper surface pads 126U and a plurality of first lower surface pads 126L, a second package substrate 200 including a plurality of second upper surface pads 226U and a plurality of second lower surface pads 226L, and a semiconductor chip 10, a plurality of metal core structures 50, and a plurality of solder balls 60 formed in a space between the first package substrate 100 and the second package substrate 200.

The semiconductor package 3b may include an adhesive layer 90b between the first package substrate 100 and the second package substrate 200 to surround the semiconductor chip 10. The adhesive layer 90b may surround a plurality of chip connection members 18, fill a space between an upper surface of the first package substrate 100 and a lower surface of the semiconductor chip 10, surround a side surface of the semiconductor chip 10, and fill a space between an upper surface of the semiconductor chip 10 and the lower surface of the second package substrate 200.

In some embodiments, the adhesive layer 90b may have a tapered shape in which a horizontal width and a horizontal area are reduced from the first package substrate 100 toward the second package substrate 200. For example, the adhesive layer 90b may have a shape of a truncated cone or a truncated quadrangular pyramid. In addition, a vertical cross section of the adhesive layer 90b may have a trapezoidal shape in which a length of an upper side is less than a length of a lower side. An encapsulant 70 may fill a space between the first package substrate 100 and the second package substrate 200 to surround the semiconductor chip 10, the plurality of metal core structures 50, the plurality of solder balls 60, and the adhesive layer 90b.

Figure 4C:
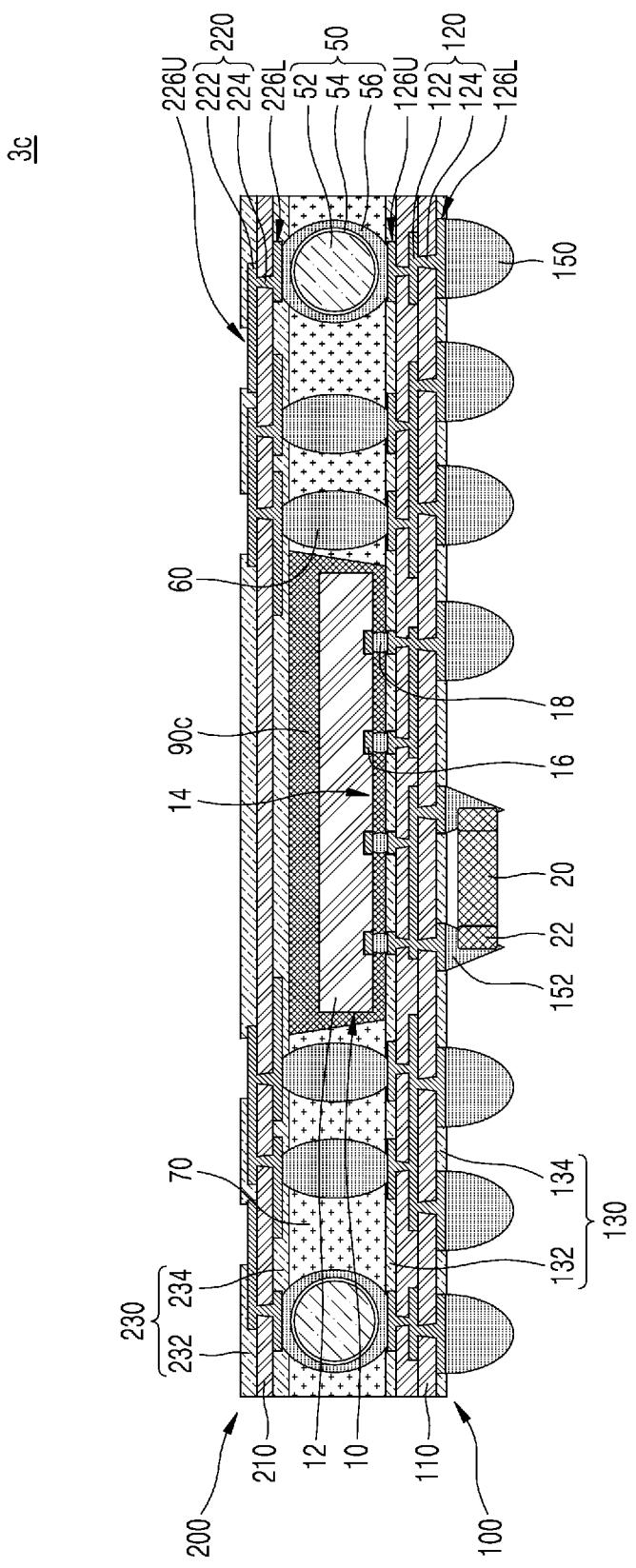

Referring to FIG. 4C, a semiconductor package 3c includes a first package substrate 100 including a plurality of first upper surface pads 126U and a plurality of first lower surface pads 126L, a second package substrate 200 including a plurality of second upper surface pads 226U and a plurality of second lower surface pads 226L, and a semiconductor chip 10, a plurality of metal core structures 50, and a plurality of solder balls 60 formed in a space between the first package substrate 100 and the second package substrate 200.

The semiconductor package 3c may include an adhesive layer 90c between the first package substrate 100 and the second package substrate 200 to surround the semiconductor chip 10. The adhesive layer 90c may surround a plurality of chip connection members 18, fill a space between an upper surface of the first package substrate 100 and a lower surface of the semiconductor chip 10, surround a side surface of the semiconductor chip 10, and fill a space between an upper surface of the semiconductor chip 10 and the lower surface of the second package substrate 200.

In some embodiments, the adhesive layer 90c may have a tapered shape in which a horizontal width and a horizontal area decrease from the first package substrate 100 toward the second package substrate 200. For example, the adhesive layer 90c may have a shape of an inverted truncated cone or an inverted truncated quadrangular pyramid. In addition, a vertical cross section of the adhesive layer 90c may have a trapezoidal shape in which a length of an upper side is greater than a length of a lower side. An encapsulant 70 may fill a space between the first package substrate 100 and the second package substrate 200 to surround the semiconductor chip 10, the plurality of metal core structures 50, the plurality of solder balls 60, and the adhesive layer 90c.

Figure 4D:
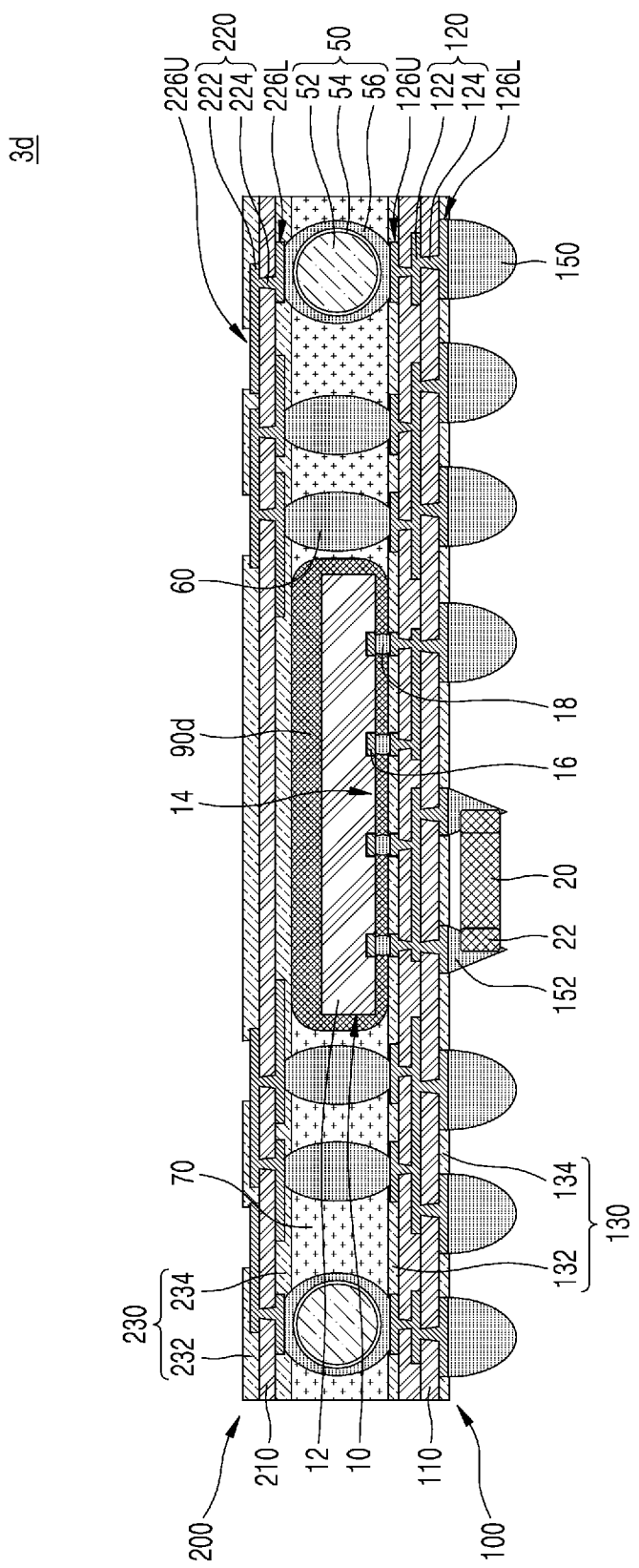

Referring to FIG. 4D, a semiconductor package 3d includes a first package substrate 100 including a plurality of first upper surface pads 126U and a plurality of first lower surface pads 126L, a second package substrate 200 including a plurality of second upper surface pads 226U and a plurality of second lower surface pads 226L, and a semiconductor chip 10, a plurality of metal core structures 50, and a plurality of solder balls 60 formed in a space between the first package substrate 100 and the second package substrate 200.

The semiconductor package 3d may include an adhesive layer 90d between the first package substrate 100 and the second package substrate 200 to surround the semiconductor chip 10. The adhesive layer 90d may surround a plurality of chip connection members 18, fill a space between an upper surface of the first package substrate 100 and a lower surface of the semiconductor chip 10, surround a side surface of the semiconductor chip 10, and fill a space between an upper surface of the semiconductor chip 10 and the lower surface of the second package substrate 200. In some embodiments, the adhesive layer 90c may have ajar shape in which a horizontal width and a horizontal area are increased and then reduced from the first package substrate 100 toward the second package substrate 200. An encapsulant 70 may fill a space between the first package substrate 100 and the second package substrate 200 to surround the semiconductor chip 10, the plurality of metal core structures 50, the plurality of solder balls 60, and the adhesive layer 90d.

Figure 4E:
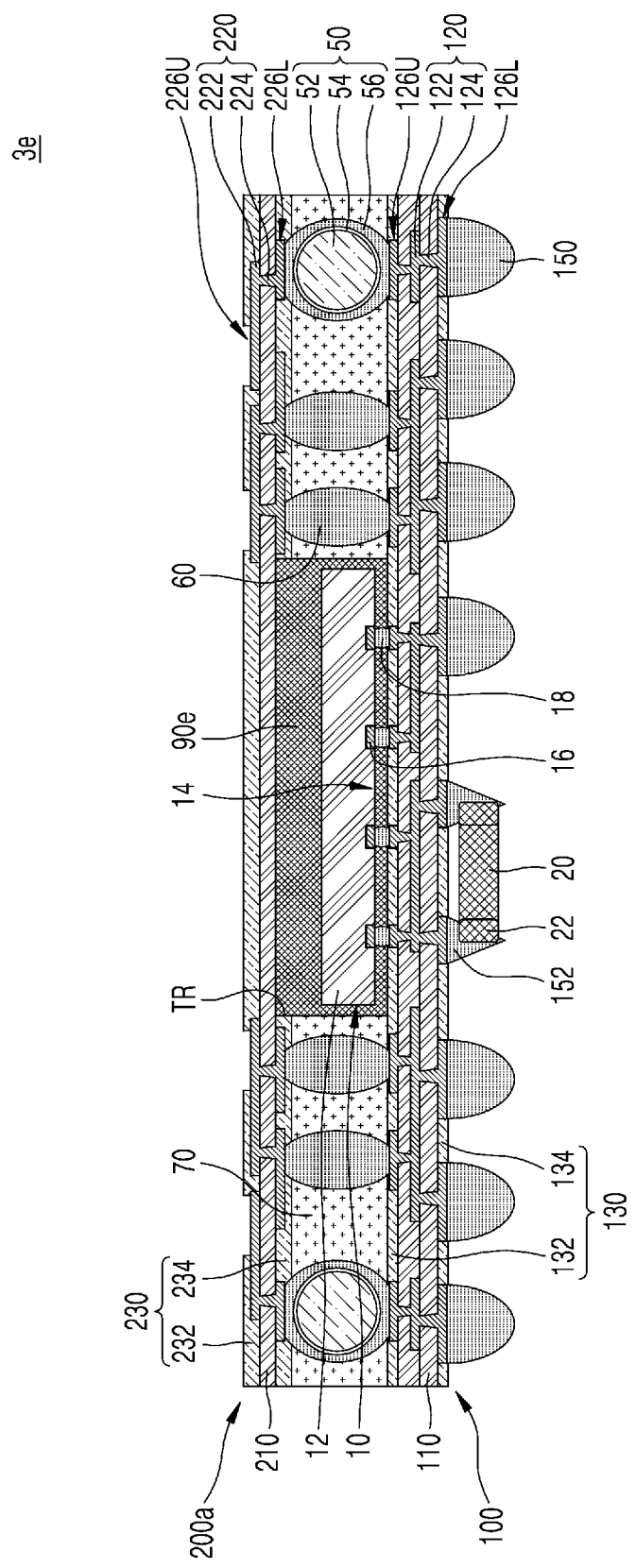

Referring to FIG. 4E, a semiconductor package 3e includes a first package substrate 100 including a plurality of first upper surface pads 126U and a plurality of first lower surface pads 126L, a second package substrate 200a including a plurality of second upper surface pads 226U and a plurality of second lower surface pads 226L, and a semiconductor chip 10, a plurality of metal core structures 50, and a plurality of solder balls 60 formed in a space between the first package substrate 100 and the second package substrate 200a.

The semiconductor package 3e may include an adhesive layer 90e between the first package substrate 100 and the second package substrate 200 to surround the semiconductor chip 10. The adhesive layer 90e may surround a plurality of chip connection members 18, fill a space between an upper surface of the first package substrate 100 and a lower surface of the semiconductor chip 10, surround a side surface of the semiconductor chip 10, and fill a space between an upper surface of the semiconductor chip 10 and the lower surface of the second package substrate 200.

The second package substrate 200a may have a trench TR accommodating at least a part of the adhesive layer 90e at a lower portion thereof. The trench TR of the second package substrate 200a may be a groove formed concavely in a direction from a lower surface of the second package substrate 200a toward an upper surface thereof. Although FIG. 4E illustrates that the trench TR is formed in a second lower surface solder resist layer 234 of the second package substrate 200a, this is an example and the inventive concept is not limited thereto. In some embodiments, the trench TR may extend through the second lower surface solder resist layer 234 into a second substrate base 210 of the second package substrate 200a.

In some embodiments, a horizontal cross-section of the trench TR of the second package substrate 200a may have a rectangular shape or a circular shape, but the shape of the horizontal cross-section of the trench TR is not limited thereto. In addition, a vertical depth of the trench TR of the second package substrate 200a may be from about 5 μm to about 100 μm. In addition, a vertical depth of the trench TR of the second package substrate 200a may be less than a vertical length of the adhesive layer 90e. For example, the vertical depth of the trench TR of the second package substrate 200a may be from about 5% to about 20% of the vertical length of the adhesive layer 90e.

Because the second package substrate 200a has the trench TR thereunder, the second package substrate 200a may surround at least a part of the adhesive layer 90e. In addition, a vertical height of the adhesive layer 90e may be greater than a vertical height of the encapsulant 70. The encapsulant 70 may fill a space between the first package substrate 100 and the second package substrate 200 and may surround the semiconductor chip 10, the plurality of metal core structures 50, the plurality of solder balls 60, and the adhesive layer 90e.

Because the semiconductor package 3e has the adhesive layer 90e filling the trench TR of the second package substrate 200a, structural reliability of the semiconductor package 3e may be increased.

Figure 4F:
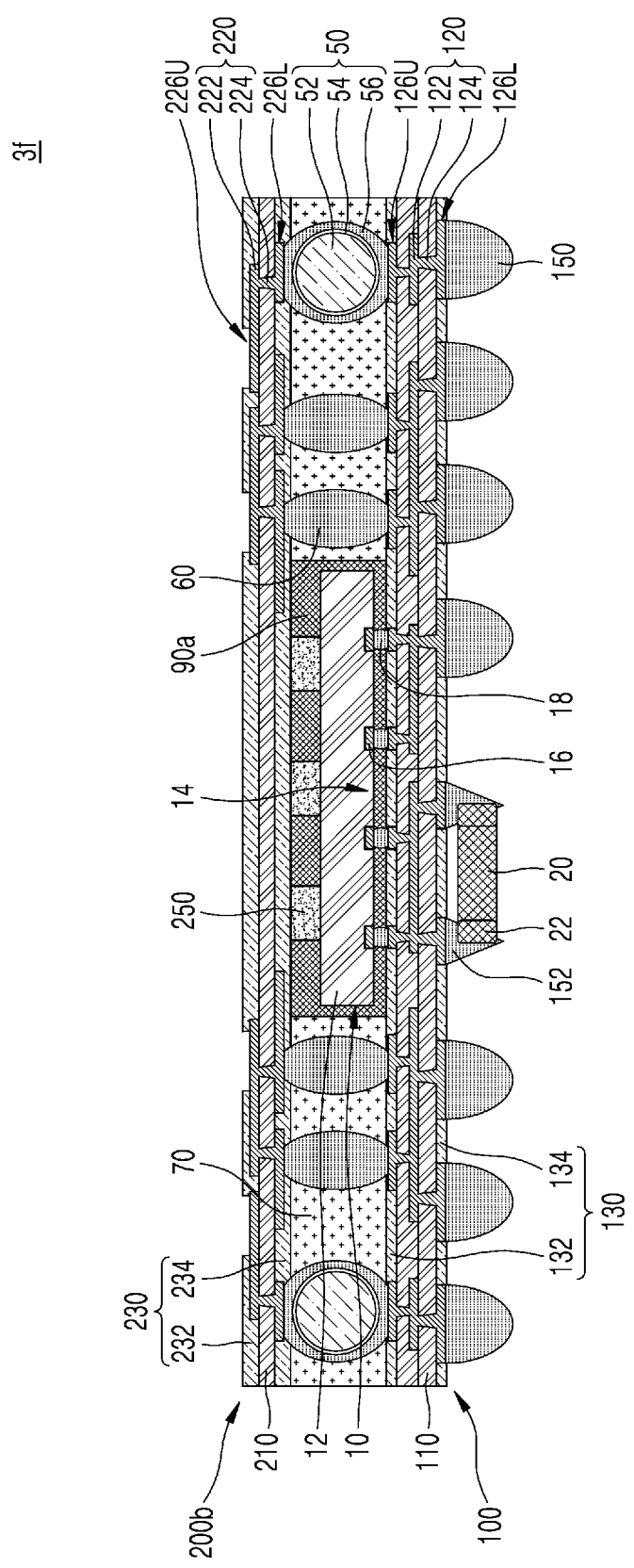

Referring to FIG. 4F, a semiconductor package 3f includes a first package substrate 100 including a plurality of first upper surface pads 126U and a plurality of first lower surface pads 126L, a second package substrate 200b including a plurality of second upper surface pads 226U and a plurality of second lower surface pads 226L, and a semiconductor chip 10, a plurality of metal core structures 50, and a plurality of solder balls 60 formed in a space between the first package substrate 100 and the second package substrate 200b.

The second package substrate 200b may include a solder resist patch 250 protruding from a second lower surface solder resist layer 234. The solder resist patch 250 may be in contact with an upper surface of the semiconductor chip 10. In some embodiments, the second package substrate 200b may include a plurality of solder resist patches 250 isolated from each other to have an uneven shape in which a concave portion and a convex portion are alternately repeated from the second lower surface solder resist layer 234. In some embodiments, the solder resist patch 250 may be formed of substantially the same material as the second lower surface solder resist layer 234.

The semiconductor package 3f may include an adhesive layer 90a between the first package substrate 100 and the second package substrate 200 to surround the semiconductor chip 10. The adhesive layer 90a may surround a plurality of chip connection members 18, fill a space between an upper surface of the first package substrate 100 and a lower surface of the semiconductor chip 10, surround a side surface of the semiconductor chip 10, and fill a space between an upper surface of the semiconductor chip 10 and the lower surface of the second package substrate 200 to surround the solder resist patch 250. An encapsulant 70 may fill a space between the first package substrate 100 and the second package substrate 200 to surround the semiconductor chip 10, the plurality of metal core structures 50, the plurality of solder balls 60, and the adhesive layer 90a.

Because the semiconductor package 3f includes the adhesive layer 90a and the solder resist patch 250, voids are not generated in a space between the first package substrate 100 and the second package substrate 200, the space between the first package substrate 100 and the second package substrate 200 is maintained, and thus, structural reliability of the semiconductor package 3f may be increased.

Figure 5A:
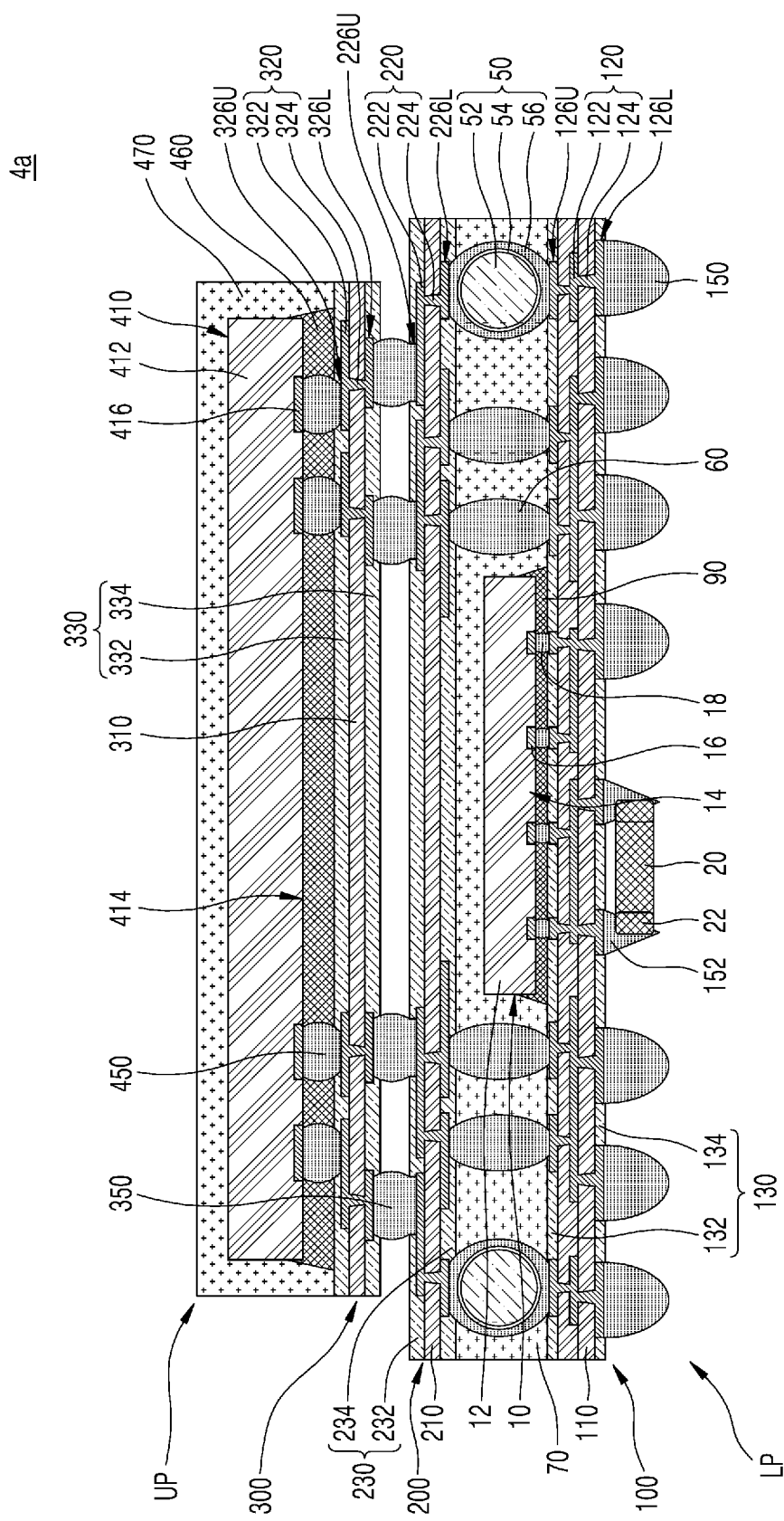
FIGS. 5A and 5B are cross-sectional views of semiconductor packages of a package on package (PoP) type according to an embodiment.
Figure 5B:
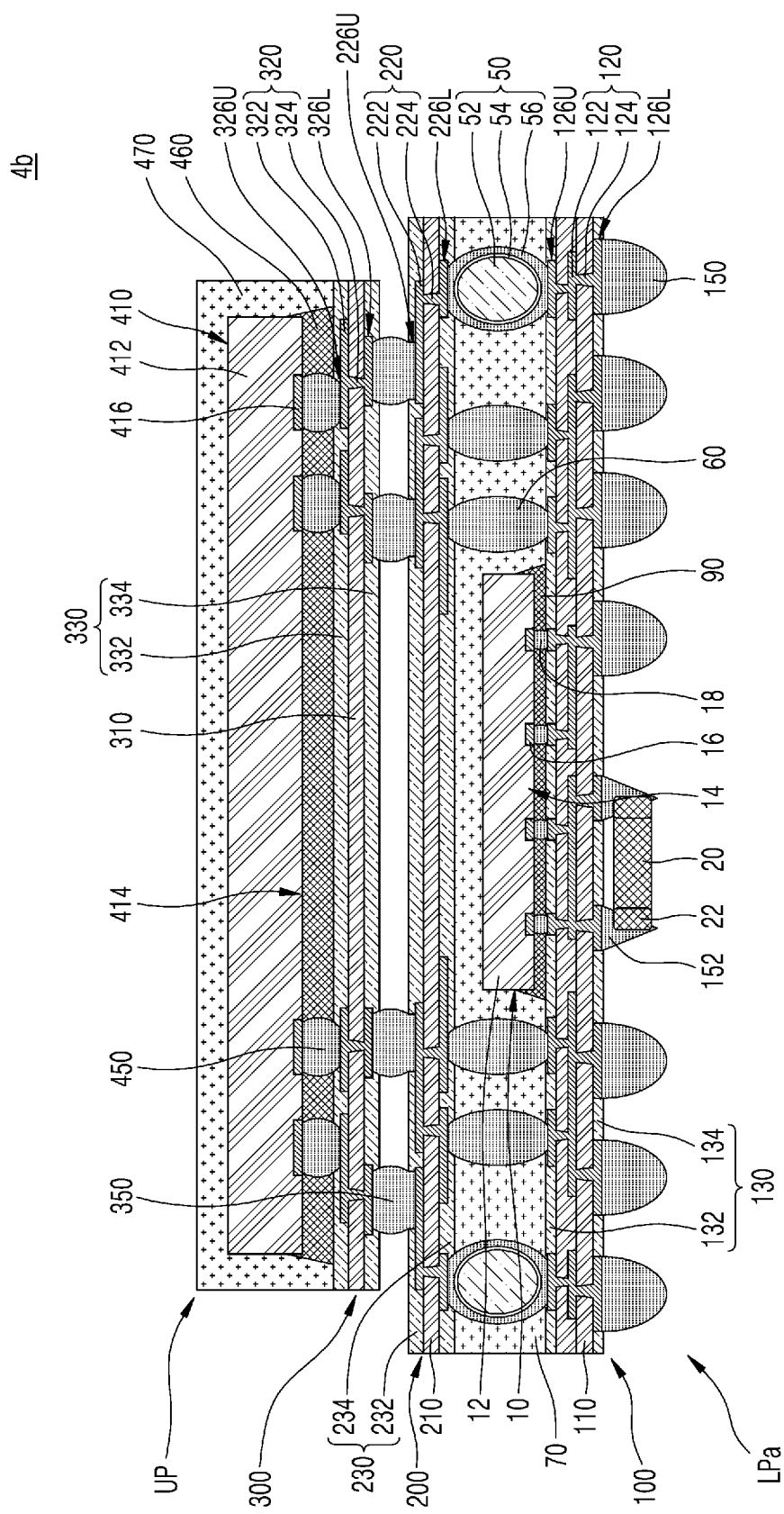

FIGS. 5A and 5B are cross-sectional views of semiconductor packages of a package on package (PoP) type according to the inventive concept. In descriptions to be made with reference to FIGS. 5A and 5B, descriptions overlapping the descriptions made with reference to FIGS. 1A and 1B are omitted.

Referring to FIG. 5A, a semiconductor package 4a may include a semiconductor package of a PoP type in which an upper package UP is attached onto a lower package LP.

The lower package LP may be the same as the semiconductor package 1a illustrated in FIG. 1A. The lower package LP may include a first package substrate 100, a first semiconductor chip 10 attached onto the first package substrate 100, and a second package substrate 200 covering the first semiconductor chip 10. The first semiconductor chip 10 may include a first semiconductor substrate 12 having an active surface and an inactive surface opposite to each other, a first semiconductor device 14 formed on the active surface of the first semiconductor substrate 12, and a plurality of first chip pads 16 on a first surface of the first semiconductor chip 10.

A first encapsulant 70 may fill a space between the first package substrate 100 and the second package substrate 200 to surround the first semiconductor chip 10. In some embodiments, a first underfill layer 90 may be between a lower surface of the first semiconductor chip 10 and an upper surface of the first package substrate 100. The first underfill layer 90 may surround a plurality of first chip connection members 18. A plurality of metal core structures 50 and a plurality of solder balls 60 passing through the first encapsulant 70 may be between the first package substrate 100 and the second package substrate 200.

The upper package UP may include a third package substrate 300, a second semiconductor chip 410 attached onto an upper surface of the third package substrate 300, a second encapsulant 470 surrounding the second semiconductor chip 410, and a plurality of package connection members 350 (e.g., interconnection terminals) attached onto a lower surface of the third package substrate 300. The plurality of package connection members 350 may be connected to a plurality of second upper surface pads 226U.

The third package substrate 300 may include a third substrate base 310, and third wiring structures 320 that each include a plurality of third wiring patterns 322 on upper and lower surfaces of the third substrate base 310 and a plurality of third substrate vias 324 passing through at least a part of the third substrate base 310. In some embodiments, the third package substrate 300 may have a stacked structure in which a plurality of third substrate bases 310 are stacked, and the plurality of third wiring patterns 122 may be arranged on upper and lower surfaces of each of the plurality of third substrate bases 310. Some of each of the plurality of third wiring patterns 322 may be a third upper surface pad 126U on an upper surface of the third package substrate 300, and others thereof may be a third lower surface pad 326L on a lower surface of the third package substrate 300. Among the plurality of third upper surface pads 326U and the plurality of third lower surface pads 326L, the third upper surface pad 326U and the third lower surface pad 326L corresponding to each other may be electrically connected to each other through some of the plurality of third substrate vias 324, or through some of the plurality of third wiring patterns 322 and some of the plurality of third substrate vias 324.

In some embodiments, the third package substrate 300 may further include a third solder resist layer 330 covering upper and lower surfaces of the third substrate base 310. The third solder resist layers 330 may include a third upper surface solder resist layer 332 that exposes the plurality of third upper surface pads 326U and covers an upper surface of the third substrate base 310, and a third lower surface solder resist layer 334 that exposes the plurality of third lower surface pads 326L and covers a lower surface of the third substrate base 310.

A plurality of package connection members 350 may be attached onto the plurality of third lower surface pads 326L. For example, the plurality of package connection members 350 may be between the plurality of second upper surface pads 226U and the plurality of third lower surface connection pads 326L.

The third package substrate 300, the third substrate base 310, the third wiring structure 320, and the third solder resist layer 330 may be respectively and substantially similar to the first package substrate 100, the first substrate base 110, the first wiring structure 120, and the first solder resist layer 130, and thus redundant descriptions thereof are omitted.

The second semiconductor chip 410 may include a second semiconductor substrate 412 having an active surface and an inactive surface opposite to each other, a second semiconductor device 414 formed on the active surface of the second semiconductor substrate 412, and a plurality of second chip pads 416 on a first surface of the second semiconductor chip 410. The second semiconductor chip 410 may be electrically connected to the third package substrate 300 through a plurality of second chip connection members 450 (e.g., connection terminals) connecting the plurality of second chip pads 416 to the plurality of third upper surface pads 326U. The second semiconductor chip 410 may be substantially similar to the first semiconductor chip 10, and thus, redundant descriptions thereof are omitted.

The second semiconductor chip 410, the second semiconductor substrate 412, the second semiconductor device 414, the second chip pad 416, and the second chip connection member 418 may be respectively referred to as an upper semiconductor chip 410, an upper semiconductor substrate 412, an upper semiconductor device 414, an upper chip pad 416, and an upper chip connection member 418.

In some embodiments, the first semiconductor chip 10 may include a central processing unit chip, a graphics processing unit chip, or an application processor chip, and the second semiconductor chip 410 may include a semiconductor memory chip.

In some embodiments, a second underfill layer 460 surrounding the plurality of second chip connection members 418 may be between a second surface, for example, a lower surface of the second semiconductor chip 410 and the third package substrate 300. In some embodiments, a second encapsulant 470 may cover an upper surface of the third package substrate 300 to surround the second semiconductor chip 410 and the second underfill layer 460.

FIG. 5A illustrates that the second semiconductor chip 410 has a face-up arrangement and is attached onto an upper surface of the third package substrate 300 but it is not limited thereto. For example, the second semiconductor chip 410 may have a face-down arrangement and may be attached onto the upper surface of the third package substrate 300.

A lower package LP of the semiconductor package 4a is illustrated as the semiconductor package 1a illustrated in FIG. 1, but it is also apparent to those skilled in the art that the lower package LP may be one of the semiconductor packages shown in FIGS. 4A to 4F.

In the semiconductor package 4a according to the inventive concept, a plurality of metal core structures 50 respectively having metal core balls 52 may be between the first package substrate 100 and the second package substrate 200, and when the second package substrate 200 is attached onto the first package substrate 100, a distance between the first package substrate 100 and the second package substrate 200 may be maintained by the plurality of metal core structures 50 even when pressure is applied thereto, and thus, structural reliability of the semiconductor package 4a may be increased.

Because the plurality of metal core structures 50 are symmetrically arranged in a plan view, when the second package substrate 200 is attached onto the first package substrate 100, the second package substrate 200 is prevented from being inclined or warped, and thus, reliability of an electrical connection between the first package substrate 100 and the second package substrate 200 may be increased.

In addition, the plurality of second upper surface pads 226U are at portions that do not vertically overlap the plurality of metal core structures 50, and thus, when the second package substrate 200 is attached onto the first package substrate 100, the plurality of second upper surface pads 226U may be prevented from wrinkling even when pressure is applied thereto because the plurality of second upper surface pads 226U are not arranged on the plurality of metal core structures 50 respectively having a relatively hard metal core balls 52. Accordingly, reliability of an electrical connection with the upper package UP electrically connected to the plurality of second upper surface pads 226U through the plurality of second chip connection members 450 may be increased.

Referring to FIG. 5B, a semiconductor package 4b may include a semiconductor package of a PoP type in which an upper package UP is attached onto a lower package LPa.

The lower package LPa may be the semiconductor package 1b illustrated in FIG. 1B. The lower package LPa may include a first package substrate 100, a semiconductor chip 10 attached onto the first package substrate 100, and a second package substrate 200 covering the semiconductor chip 10.

A first encapsulant 70 may fill a space between the first package substrate 100 and the second package substrate 200 to surround the first semiconductor chip 10. A plurality of metal core structures 50a and a plurality of solder balls 60 passing through the first encapsulant 70 may be between the first package substrate 100 and the second package substrate 200.

The upper package UP may include a third package substrate 300, a second semiconductor chip 410 attached onto an upper surface of the third package substrate 300, and a second encapsulant 470 surrounding the second semiconductor chip 410.

While the inventive concept has been particularly shown and described with reference to embodiments thereof, it will be understood that various changes in form and details may be made therein without departing from the spirit and scope of the following claims.

What is claimed is:

1. A semiconductor package comprising:
   a first package substrate having a lower surface and an upper surface respectively including a plurality of first lower surface pads and a plurality of first upper surface pads;
   a second package substrate having a lower surface and an upper surface respectively including a plurality of second lower surface pads and a plurality of second upper surface pads, wherein the plurality of second upper surface pads comprise all of the upper surface pads at the upper surface of the second package substrate;
   a semiconductor chip provided between the first package substrate and the second package substrate and attached onto the first package substrate;
   a plurality of metal core structures connecting some of the plurality of first upper surface pads to some of the plurality of second lower surface pads and not vertically overlapping any of the plurality of second upper surface pads, each metal core structure having a metal core ball; and
   a plurality of solder balls of which at least some vertically overlap the plurality of second upper surface pads, the plurality of solder balls connecting others of the plurality of first upper surface pads to others of the plurality of second lower surface pads,
   wherein each of the plurality of metal core structures includes the metal core ball and a solder layer surrounding the metal core ball.

2. The semiconductor package of claim 1, wherein a maximum horizontal width of each of the plurality of metal core structures is greater than a maximum horizontal width of each of the plurality of solder balls.

3. The semiconductor package of claim 1, wherein the metal core ball has a spherical shape having a maximum horizontal width equal to a maximum vertical height.

4. The semiconductor package of claim 1, wherein the metal core ball has a rugby ball shape having a maximum vertical height greater than a maximum horizontal width.

5. The semiconductor package of claim 1, wherein the plurality of metal core structures are arranged to have point symmetry with respect to a center of the first package substrate in a plan view.

6. The semiconductor package of claim 5, wherein two opposite edges of the first package substrate and two opposite edges of the semiconductor chip corresponding thereto are isolated from each other by a first distance in the plan view, and two other opposite edges of the first package substrate and two other opposite edges of the semiconductor chip corresponding thereto are isolated from each other by a second distance less than the first distance in the plan view, and
   wherein the plurality of metal core structures are between the two opposite edges of the first package substrate and the two opposite edges of the semiconductor chip corresponding thereto.

7. The semiconductor package of claim 1, wherein the plurality of metal core structures form a plurality of core structure groups, each group respectively including at least two of the metal core structures, and
   wherein the plurality of core structure groups are arranged to have point symmetry with respect to a central portion of the first package substrate in a plan view.

8. The semiconductor package of claim 1, further comprising:
   an upper package including a plurality of package connection members attached to at least some of the plurality of second upper surface pads, and an upper semiconductor chip electrically connected to the plurality of package connection members.

9. A semiconductor package comprising:
   a first package substrate having a lower surface and an upper surface respectively including a plurality of first lower surface pads and a plurality of first upper surface pads;
   a second package substrate having a lower surface and an upper surface respectively including a plurality of second lower surface pads and a plurality of second upper surface pads wherein the plurality of second upper surface pads comprise all of the upper surface pads at the upper surface of the second package substrate;
   a semiconductor chip provided between the first package substrate and the second package substrate and attached onto the first package substrate;
   a plurality of metal core structures and a plurality of solder balls, separate from each other, connected between the plurality of first upper surface pads and the plurality of second lower surface pads, and arranged around the semiconductor chip to be isolated from the semiconductor chip in a plan view; and
   an encapsulant filling a space between the first package substrate and the second package substrate, and encapsulating the semiconductor chip, the plurality of metal core structures, and the plurality of solder balls,
   wherein the plurality of metal core structures do not vertically overlap any of the plurality of second upper surface pads, and
   wherein at least some of the plurality of solder balls vertically overlap some of the plurality of second upper surface pads, respectively, and others of the plurality of solder balls do not vertically overlap any of the plurality of second upper surface pads.

10. The semiconductor package of claim 9, wherein a vertical height of each of the plurality of metal core structures is equal to a vertical height of each of the plurality of solder balls, and wherein a maximum horizontal width of each of the plurality of metal core structures is equal to a maximum horizontal width of each of the plurality of solder balls.

11. The semiconductor package of claim 9, wherein each of the plurality of metal core structures includes a metal core ball having a spherical shape, and a barrier layer conformally covering a surface of the metal core ball, wherein the solder layer surrounds the barrier layer.

12. The semiconductor package of claim 9, wherein the plurality of metal core structures form a plurality of core structure groups, each respectively including at least two of the metal core structures, and wherein the plurality of core structure groups are arranged to have point symmetry with respect to a center of the first package substrate in a plan view.

13. The semiconductor package of claim 12, wherein the plurality of core structure groups are arranged between two opposite edges of the first package substrate and two opposite edges of the semiconductor chip corresponding thereto in a plan view, and are not arranged between two other opposite edges of the first package substrate and two other opposite edges of the semiconductor chip corresponding thereto.

14. The semiconductor package of claim 13, wherein a distance between the two opposite edges of the first package substrate and the two opposite edges of the semiconductor chip corresponding thereto is greater than a distance between the two other opposite edges of the first package substrate and the two other opposite edges of the semiconductor chip corresponding thereto.

15. A semiconductor package comprising:
a first package substrate having a lower surface and an upper surface respectively including a plurality of first lower surface pads and a plurality of first upper surface pads;
a second package substrate having a lower surface and an upper surface respectively including a plurality of second lower surface pads and a plurality of second upper surface pads;
a semiconductor chip provided between the first package substrate and the second package substrate and attached onto the first package substrate;
an encapsulant filling a space between the first package substrate and the second package substrate and surrounding the semiconductor chip; and
a plurality of metal core structures and a plurality of solder balls, separate from each other, passing through the encapsulant to connect the plurality of first upper surface pads to the plurality of second lower surface pads, and arranged around the semiconductor chip to be isolated from the semiconductor chip in a plan view,
wherein the plurality of metal core structures each include a metal core ball not including solder,
wherein the plurality of metal core structures are arranged to have point symmetry with respect to a central portion of the first package substrate in a plan view and do not vertically overlap the plurality of second upper surface pads, and
wherein at least some of the plurality of solder balls vertically overlap the plurality of second upper surface pads, and others of the plurality of solder balls do not overlap the plurality of second upper surface pads.

16. The semiconductor package of claim 15, wherein each of the plurality of metal core structures includes the metal core ball having a spherical shape, a solder layer surrounding the metal core ball, and a barrier layer between the metal core ball and the solder layer, wherein a vertical height of each of the plurality of metal core structures is equal to a vertical height of each of the plurality of solder balls, and wherein a maximum horizontal width each metal core structure is a width from about 100 μm to about 400 μm, and a maximum horizontal width of each solder ball is smaller than the maximum horizontal width of each metal core structure, and is from about 55 μm to about 220 μm.

17. The semiconductor package of claim 16, wherein the metal core ball includes copper (Cu), and wherein the solder layer and the plurality of solder balls are formed of conductive solder.

18. The semiconductor package of claim 9, wherein each of the plurality of metal core structures includes a metal core and a solder layer surrounding the metal core.

* * * * *